(12) United States Patent
Poehlmann et al.

(10) Patent No.: US 12,363,835 B2
(45) Date of Patent: Jul. 15, 2025

(54) HUMAN INTERFACE MODULE MOUNTING DEVICE

(71) Applicant: Rockwell Automation Technologies, Inc., Mayfield Heights, OH (US)

(72) Inventors: Joseph S. Poehlmann, Cedarburg, WI (US); Bruce W. Weiss, Milwaukee, WI (US)

(73) Assignee: Rockwell Automation Technologies, Inc., Mayfield Heights, OH (US)

( * ) Notice: Subject to any disclaimer, the term of this patent is extended or adjusted under 35 U.S.C. 154(b) by 61 days.

(21) Appl. No.: 18/506,456

(22) Filed: Nov. 10, 2023

(65) Prior Publication Data

US 2025/0159816 A1 May 15, 2025

(51) Int. Cl.
*H05K 5/00* (2025.01)

(52) U.S. Cl.
CPC ................... *H05K 5/0017* (2013.01)

(58) Field of Classification Search
CPC .... H04N 5/655; H05K 5/0217; H05K 13/046; H05K 7/1452; H05K 5/069; H05K 5/0065; H05K 5/0069; H05K 2201/10424; H05K 7/18; G06F 1/1601
See application file for complete search history.

(56) References Cited

U.S. PATENT DOCUMENTS

2022/0279665 A1\* 9/2022 Mcdonald ............ H05K 5/0017

\* cited by examiner

*Primary Examiner* — James Wu
*Assistant Examiner* — Dakota M Talbert

(57) ABSTRACT

Embodiments of the present technology provide systems and methods for mounting a human interface module (HIM). According to various embodiments, the HIM may be configured to mount alternatively to a panel and a cradle. A panel mounting device is used to mount the HIM to a panel. The panel mounting device can be removably coupled to the HIM for panel mounting. The HIM may be installed in a cradle without the panel mounting device in accordance with some embodiments.

20 Claims, 18 Drawing Sheets

HUMAN INTERFACE MODULE MOUNTING DEVICE

TECHNICAL FIELD

The disclosure relates to systems and methods for mounting a human interface module. More specifically, this disclosure relates to a kit for mounting a human interface module in more than one configuration.

BACKGROUND

In industrial environments, a human interface module (HIM) provides users with the ability to interface with industrial automation controllers such as motor drives. Various controllers may have different means for electrically connecting to the HIMs. The way the HIM is mounted may depend, for example, on whether the controller is located behind a panel. Multiple different HIM designs have been used to accommodate the various mounting arrangements. This has resulted in inconvenience and increased costs for users.

SUMMARY

The disclosure describes systems and methods by which a human interface module (HIM) may be alternatively mounted to a panel or to a cradle to electrically connect to a controller such as a motor drive. In some cases, the HIM may be placed in a cradle to electrically connect to a controller. In such cases, the cradle may be attached to or mounted to a controller. At other times, the controller may be located behind a panel. In such cases, the HIM located outside the panel may connect to the motor drive via a cable through a hole in the panel. Accessories allow a HIM to be convertible from a cradle-mounted HIM to a panel-mounted HIM and vice versa. This allows a user to purchase the same HIM model regardless of whether the user requires a cradle-mounted HIM or a panel-mounted HIM.

Some embodiments of the present disclosure include a system including a human interface module that includes an electrical port. In some embodiments the electrical port includes a connector, where the connector receives an electrical connection that electrically couples the human interface module with an industrial automation controller. Some embodiments include a casing including a back board, the back board including a mounting port. The connector of the electrical port is disposed in the mounting port. In some embodiments the mounting port includes a circular opening disposed in the back board, at least one notch, each notch extending from the circular opening and disposed about a circumference of the circular opening. Some embodiments include a panel mounting device, including a cylindrical protrusion. In some embodiments the cylindrical protrusion includes a first end, a second end, a threaded section disposed between the first end and the second end, and at least one projection extending radially outward from the first end, each projection corresponding to one of the at least one notches of the mounting port. In some embodiments the at least one projection aligns with the at least one notch of the mounting port to couple the panel mounting device to the human interface module.

In some embodiments the electrical port is a first electrical port. In some embodiments the system further includes: a cradle mounting device. Some embodiments include a cradle, including one or more clips that couple with the human interface module to secure the human interface module in the cradle; and a second electrical port, including: a controller side electrically coupled to the industrial automation controller, and an interface side comprising a second connector disposed on the cradle and that aligns with and electrically couples to the connector of the electrical port of the human interface module to electrically couple the human interface module with the industrial automation controller.

In some embodiments the at least one notch include three notches, each notch having the same shape and size, wherein the three notches are not evenly spaced about the circumference of the circular opening.

Some embodiments include at least one projection comprises three projections. In some embodiments each of the three projections aligns with one of the three notches.

In some embodiments the mounting port further includes a circular collar disposed around the circular opening such that a center of the circular collar is at a center of the circular opening, wherein the circular collar engages with a clip, and wherein the clip secures the cylindrical protrusion to the back board when the clip is engaged with the circular collar.

In some embodiments the clip includes a C-shaped body; and the cylindrical protrusion further includes a groove corresponding to the C-shaped body that engages with the C-shaped body.

Some embodiments include a circular gasket surrounding the circular collar. In some embodiments the circular gasket includes: a first side that forms a seal with the back board of the human interface module, and a second side that forms a seal with a panel.

Some embodiments include a cradle mounting device that engages with the circular collar, the cradle mounting device comprising: a circular body that covers the circular opening of the mounting port, the circular body including a hole that receives the connector of the electrical port.

Some embodiments include a cradle that receives the human interface module, the cradle including: two attachment holes; and wherein the cradle mounting device further includes: two extension arms extending laterally from the circular body, wherein each of the two extension arms fit within one of the two attachment holes of the cradle.

In some embodiments the cylindrical protrusion further includes: an alignment extension that aligns with an alignment notch in a panel hole in a panel of a cabinet housing enclosing the industrial automation controller.

Some embodiments include a nut that engages with the threaded section of the cylindrical protrusion.

One example of a method performed according to some embodiments includes: removing a cradle mounting device from a mounting port of the human interface module, where the human interface module includes a housing, the housing including a back board, where the mounting port is disposed in the back board, and where the mounting port includes a circular opening disposed on the back board, and where the mounting port further includes at least one notch, each notch extending from the circular opening and disposed about the circumference of the circular opening. The method further includes attaching a cylindrical protrusion to the mounting port, where the cylindrical protrusion includes a first end, a second end, a threaded section disposed between the first end and the second end, and at least one projection extending radially outward from the first end, each projection corresponding to one of the at least one notches of the mounting port, where the attaching the cylindrical protrusion to the mounting port includes inserting each of the at least one projection into each of the at least one notch of the circular opening; inserting the cylindrical protrusion in a hole in a panel. Some embodiments include fastening a nut onto the threaded section of the cylindrical protrusion.

These and other features and aspects of various examples may be understood in view of the following detailed discussion and accompanying drawings.

BRIEF DESCRIPTION OF THE DRAWINGS

Many aspects of the disclosure can be better understood with reference to the following drawings. The components in the drawings are not necessarily drawn to scale. Moreover, in the drawings, like reference numerals designate corresponding parts throughout the several views. While several embodiments are described in connection with these drawings, the disclosure is not limited to the embodiments disclosed herein. On the contrary, the intent is to cover all alternatives, modifications, and equivalents.

DETAILED DESCRIPTION

In industrial environments, a human interface module (HIM) provides users with the ability to interface with controllers including motor drives. Various controllers may have different means for electrically connecting to the HIMs. For example, a controller may have a housing with a built-in cradle. The HIM can be mounted in the cradle to directly connect to the controller. However, sometimes the controller may be in a location not conveniently accessible; for example, the controller may be located behind a panel. In such cases, the HIM may be mounted to the panel and connected to the controller via a cable through a hole in the panel. HIMs may be manufactured and sold in separate models to accommodate different mounting methods. Specifically, while one model may be configured for cradle mounting of the HIM, a separate model may be configured for panel mounting of the HIM. However, the use of separate HIM models to accommodate different mounting arrangements creates inconvenience for users and increases the cost of the HIM.

The present disclosure describes a HIM that is configurable to mount either to a cradle or a panel. Accessories attached to the HIM allow the same model of HIM to be mounted to either a cradle or a panel. A panel mounting device can be attached to the mounting port of the HIM to configure the HIM for panel mounting. Alternatively, a cradle mounting device can be inserted into the mounting port to configure the HIM for cradle mounting. A user may thus purchase the same model of HIM regardless of whether cradle mounting or panel mounting is needed. This arrangement simplifies the process of selecting and purchasing HIMs, since a customer may purchase the same model of HIM without determining in advance whether panel mounting or cradle mounting is desired. The process of designing and manufacturing the HIM is also simplified, reducing costs.

The present disclosure also describes the panel mounting device including a cylindrical protrusion that is inserted into a hole in the panel for mounting the HIM to the panel. The cylindrical protrusion is shaped to fit within a standard-sized panel hole for panel mounting of the HIM. In industrial environments, hole punches such as push-button punches may be used to create standard-sized holes. Such standard-sized holes may be used to mount various components, such as indicator lights and switches, to panels. The HIM of the present disclosure may be mounted to the panel by inserting the cylindrical protrusion into such a standard-sized hole. An operator may thus create the required hole for panel mounting without a specialized tool, since a standard hole punch may be used. The present disclosure describes a HIM that can be mounted to a panel using only one standard-sized hole in the panel. This arrangement simplifies mounting of the HIM to panels by requiring only one hole instead of multiple holes that must be precisely measured.

Figure 1:
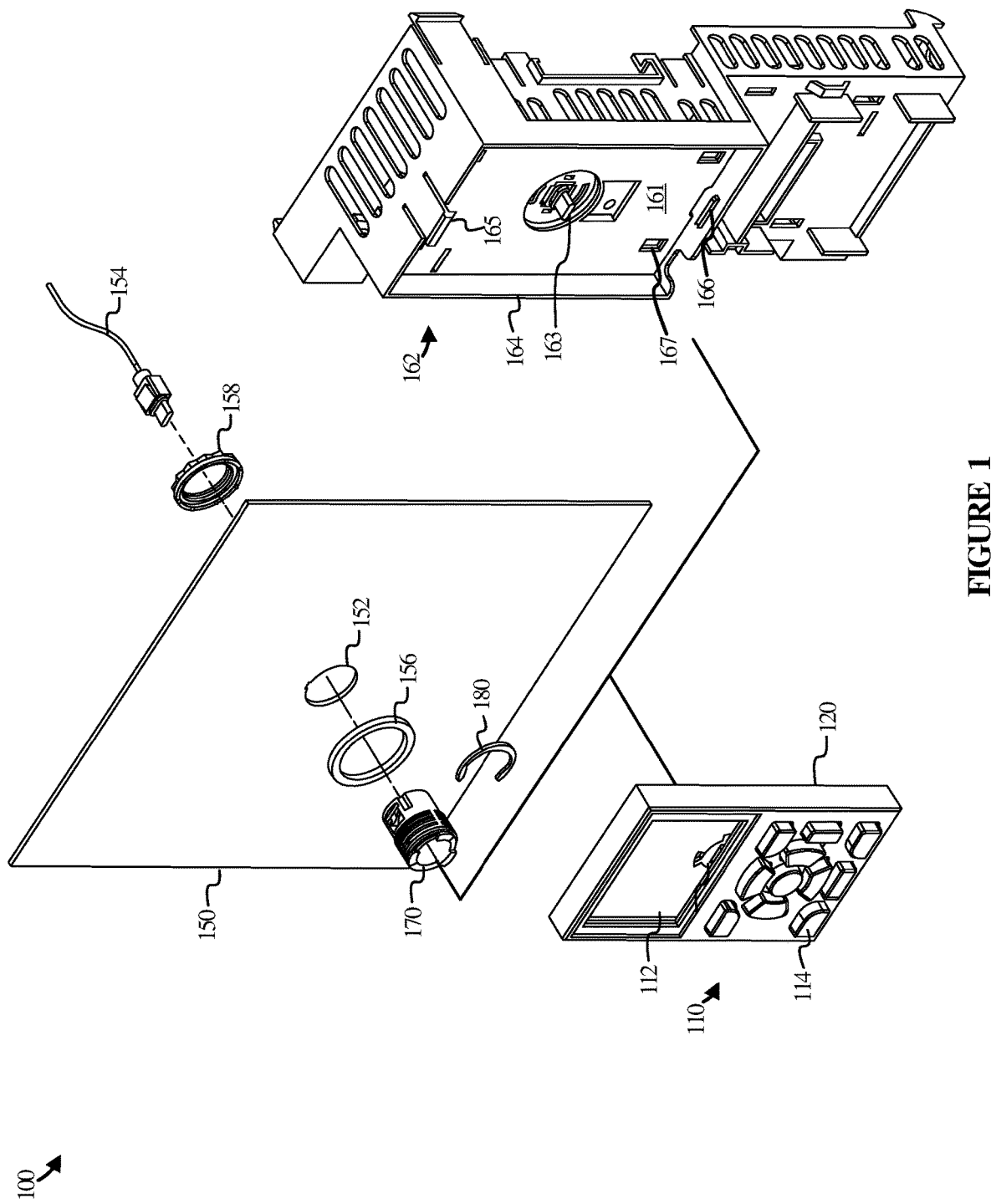
FIG. 1 shows a HIM conversion system, according to some embodiments.
Figure 19:
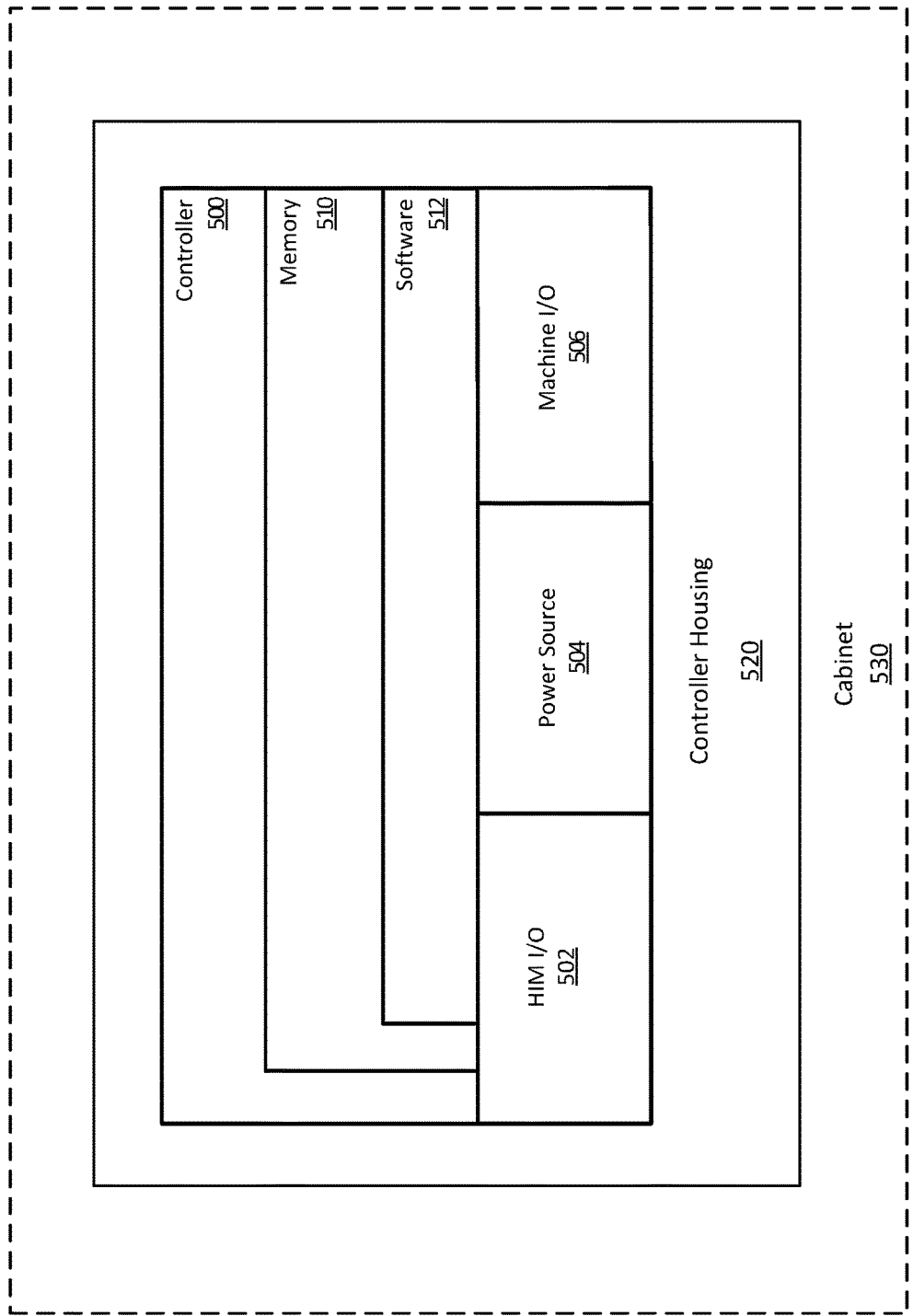
FIG. 19 shows a schematic view of an industrial automation controller, according to some embodiments.

Referring now to the figures, FIG. 1 shows a conversion system 100 according to some embodiments. The conversion system 100 includes a human interface module (HIM) 110 providing a user with the ability to interface with a controller such as a motor drive. The conversion system 100 may also include cradle 162 in which the HIM 110 may be mounted. The HIM 110 is placed in the cradle 162 to electrically connect to the controller via the electrical connector 163. Alternatively, a user may need to connect the HIM 110 to a controller located on the opposite side of a panel 150. In such cases, the HIM 110 may connect to the controller via a cable 154 through a hole 152 in the panel 150. Accordingly, the HIM 110 can be configured to mount either to the cradle 162 or to the panel 150. The panel 150 may be a wall or door of a cabinet that encloses one or more controllers, for example the cabinet 530 enclosing the controller 500 as shown in FIG. 19. In other embodiments, the panel 150 may be another wall or door.

In some embodiments the HIM 110 includes a display screen 112 and buttons 114 for user input. The HIM also includes a casing 120. In some embodiments the casing 120 is plastic. In other embodiments, the casing 120 may be another material such as composite material, metal, or any combination thereof.

The HIM 110 may connect to an industrial automation controller by mounting the HIM 110 in the cradle 162. In some embodiments the cradle 162 has a back wall 161 and side walls 164. The side walls 164 have dimensions corresponding to the dimensions of the HIM casing 120 for receiving the HIM 110. The cradle may also include a clipping extension 165, a ridge 166, and depressions 167 for securing the HIM 110 in the cradle 162. The cradle 162 also includes an electrical connector 163 for electrically connecting the industrial automation controller to the HIM 110. According to some embodiments, the cradle 162 is mounted to the housing of a controller, for example, the housing 520 of the controller 500 in FIG. 19. In other embodiments the cradle 162 may be located in another location; for example the cradle 162 may be attached to a panel such as the panel 150.

In some cases, a user may desire to connect the HIM 110 to a controller located behind the panel 150. The HIM 110 may connect to the controller via a cable 154 through a hole 152 in the panel 150. The cylindrical protrusion 170 can be attached to the HIM 110 and inserted into the hole 152. The cable 154 thus may pass through the panel 150 through the cylindrical protrusion 170 to electrically couple to the HIM 110. The cylindrical protrusion 170, the clip 180, the gasket 156, and the nut 158 are used to mount the HIM 110 to the panel 150 as discussed in greater detail below.

In some embodiments, the cylindrical protrusion 170, the gasket 156, the nut 158 and the clip 180 are collectively part of a panel mounting device. The components of the panel mounting device including gasket 156, nut 158, cylindrical protrusion 170, and clip 180 may be sold together as a kit. A user could thus purchase a single kit including all the components of the panel mounting device to allow the user to mount the HIM 110 to the panel.

Figure 2:
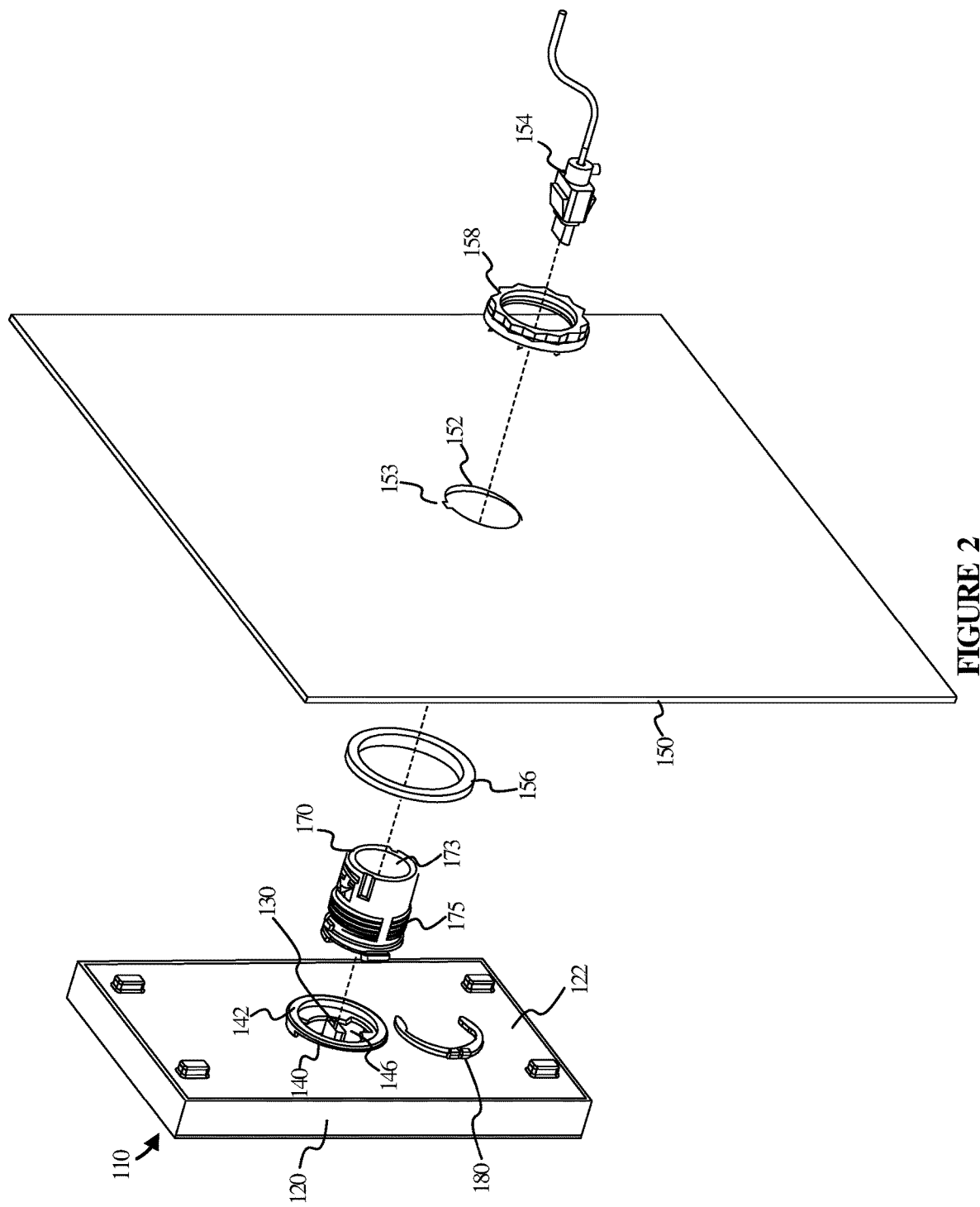
FIG. 2 shows a rear view of a panel mounting system for the HIM, according to some embodiments.

FIG. 2 shows a rear view of the conversion system 100 according to some embodiments. The casing 120 of the HIM 110 includes a back board 122 with a mounting port 140. The mounting port 140 includes a circular collar 142 and a circular opening 146. An electrical port 130 is disposed in the mounting port 140. The electrical port 130 includes a connector, as shown, that can be coupled to the connector on cable 154 for electrically coupling the HIM with the controller, such as the controller 500 in FIG. 19. The electrical port 130 may extend through the circular opening 146 of the mounting port 140.

When the HIM 110 is mounted to the panel 150, the cylindrical protrusion 170 is coupled to the mounting port 140 of the HIM 110. A clip 180 secures the cylindrical protrusion 170 to the mounting port 140 in a manner discussed in further detail below. A circular gasket 156 surrounds the circular collar 142 for sealing, such that the radially inner surface of the gasket 156 is in contact with the circular collar 142. The circular gasket 156 may be rubber or any material suitable for sealing. In some embodiments, the circular gasket 156 may not be included as it is an optional component. When the HIM 110 is mounted to the panel 150, one lateral side of the gasket 156 is in contact with, and may form a seal with, the back board 122, and the other lateral side of the gasket 156 is in contact with, and may form a seal with, the panel 150. When the cylindrical protrusion 170 is inserted into the hole 152, a nut 158 engages with the threaded section 177 of the cylindrical protrusion 170 to secure the HIM 110 to the panel 150. The seals formed by the gasket 156 help ensure dust and other debris do not enter the HIM 110 through the back panel or the cabinet or other enclosure of panel 150 via the hole 152. The cable 154 may be plugged into the electrical port 130 when the HIM 110 is mounted on the panel 150. Specifically, the cable 154 passes through the internal cavity 173 of the cylindrical protrusion 170 to plug into the electrical port 130 when the cylindrical protrusion 170 is inserted in the hole 152.

Alternatively, when the HIM 110 is mounted in the cradle 162 (as seen in FIG. 1), the cylindrical protrusion 170 is not attached to the HIM 110. Instead, the HIM electrical port 130 is coupled directly to the cradle electrical connector 163. In some embodiments the HIM electrical port 130, the cradle electrical connector 163, and the cable 154 include USB connectors such as USB Type-C connectors. In other embodiments, other connector types may be used.

The hole 152 includes a notch 153 in some embodiments, as shown in FIG. 2. The notch 153 is used for alignment of the cylindrical protrusion 170. A common punch tool may be used to punch through the panel 150 to create the hole 152 in the panel 150. The hole 152 may have standard dimensions corresponding to the dimensions of the pushbutton. For example, the hole 152 may have a width of 22.3 mm and a height of 24.1 mm, with the notch 153 having a width of 3.2 mm. In other embodiments, other dimensions may be used.

Figure 3:
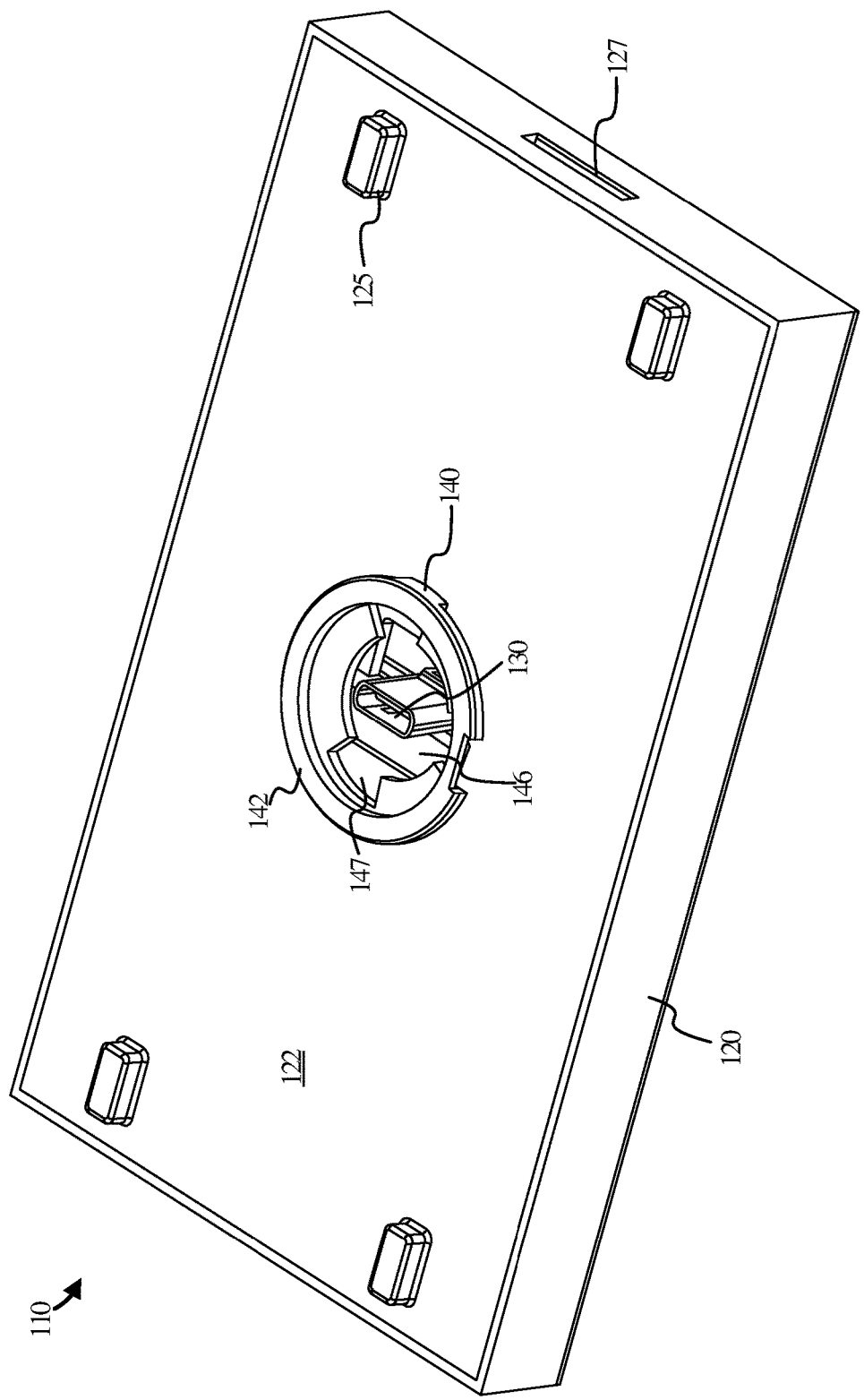
FIG. 3 shows a view of the back of the HIM, according to some embodiments.

FIG. 3 shows the back of a HIM 110 according to some embodiments. The casing 120 of the HIM includes a back board 122. The casing 120 may include a slot 127 to engage with the ridge 166 of the cradle 162 (see also FIG. 1) during cradle mounting. The casing 120 may also include feet 125 to engage with the depressions 167 of the cradle 162 during cradle mounting.

FIG. 3 also shows the back board 122 including an electrical port 130 disposed in the mounting port 140. The electrical port 130 passes through a circular opening 146 of the mounting port 140. Notches 147 extend radially outward from the circular opening 146. Some embodiments include three notches 147. In other embodiments, any other number of notches 147 may be used. The notches 147 may have the same size, but may be spaced apart at irregular intervals, as discussed in further detail below. The mounting port 140 also includes a circular collar 142 extending from the back board 122 and surrounding the circular opening 146.

Figure 4B:
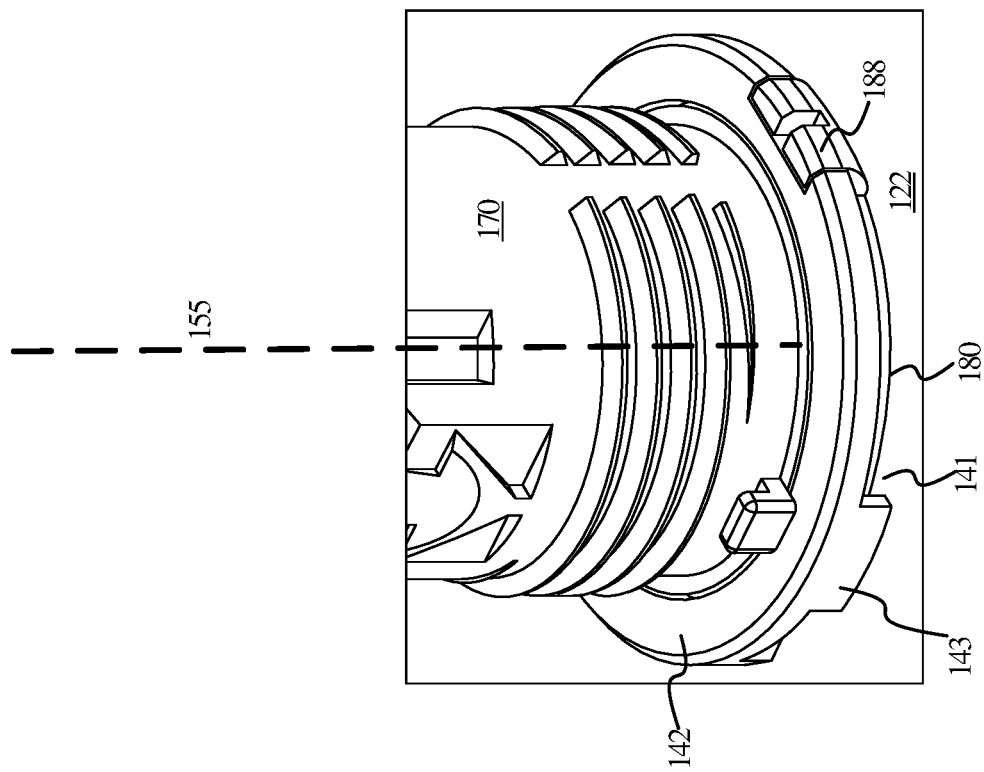
FIG. 4B shows an installed clip, according to some embodiments.
Figure 4A:
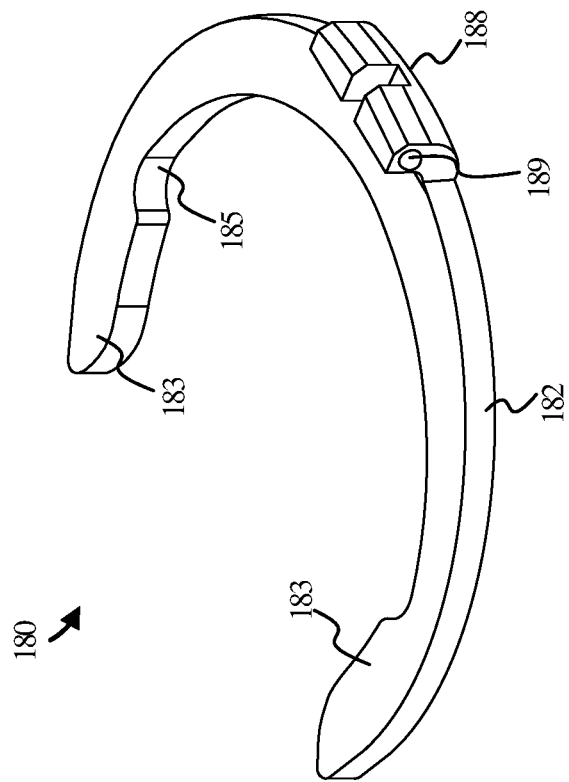
FIG. 4A shows a clip in isolation, according to some embodiments.

With reference to FIGS. 4A, the clip 180 may have a C-shaped body 182. The C-shaped body includes two thickened end portions 183 for providing a secure connection with the cylindrical protrusion 170. Specifically, with further reference to FIGS. 7A-7C, the cylindrical protrusion 170 may include a circumferential groove 174 for receiving the clip. Each end of the groove 174 includes a widened portion 175 corresponding to the thickened end portions 183 of the clip 180. When installed, the thickened end portions 183 may snap into place in the widened portions 175 of the groove, creating a secure connection. In an installed configuration, a radially inner surface 185 of the clip 180 is in contact with the groove 174 of the cylindrical protrusion 170.

The clip 180 also includes a finger hold 188, which operates as a grip for installation of the clip 180. The finger hold 188 may include a knob 189. Although only one knob 189 is visible in the view in FIG. 4A, the opposite side of the finger hold 188 may also have a knob 189. With further reference to FIG. 6B, the knob 189 may engage with a dimple 149 on the circular collar 142 to provide a secure installation of the clip 180.

In some embodiments, the clip 180 is metal. In other embodiments, the clip 180 may be another material such as a composite material or plastic.

With further reference to FIG. 4B, the circular collar 142 is attached to the back board 122 via collar supports 143. When installed, the clip 180 is inserted into the gap 141 between the circular collar 142 and the back board 122 to engage with the circumferential groove 174 of the cylindrical protrusion 170. (see FIGS. 7A-7C) The clip 180 thus prevents lateral displacement of the cylindrical protrusion 170 with respect to the back board 122 along the centerline 155 (where the centerline 155 represents an axial centerline of the cylindrical protrusion 170).

Figure 5A:
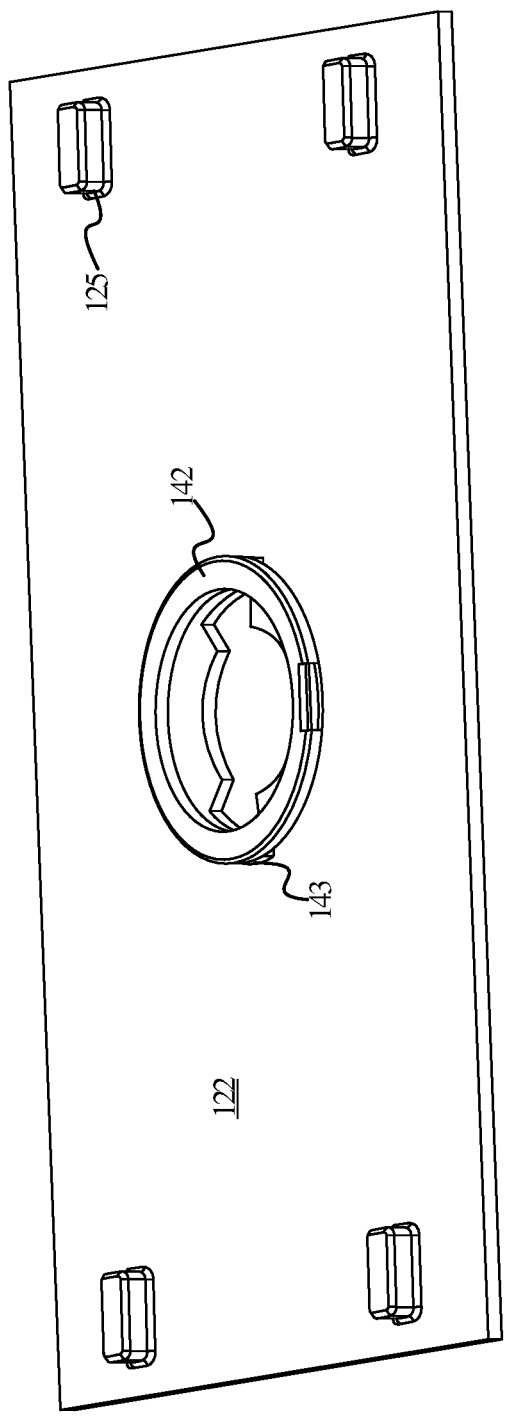
FIG. 5A shows an oblique view of the back board of the HIM, according to some embodiments.
Figure 5B:
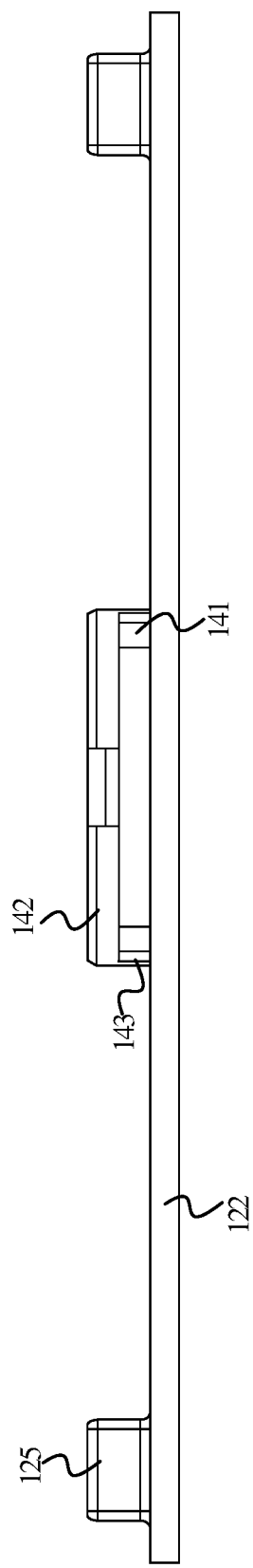
FIG. 5B shows a side view of the back board of the HIM, according to some embodiments.

FIGS. 5A and 5B show the back board 122 of the HIM 110 according to some embodiments. The back board 122 includes feet 125 for engaging with the depressions 167 of the cradle 162 when the HIM 110 is mounted in the cradle 162 (see FIG. 1).

As seen in the side view in FIG. 5B, the circular collar is supported by three collar supports 143. However, other numbers collar supports may be used in other embodiments. The circular collar 142 is displaced from the back board 122, with a gap 141 between the circular collar 142 and the back board 122. When installed, the clip 180 is inserted into the gap 141 as demonstrated in FIG. 4B.

Figure 6A:
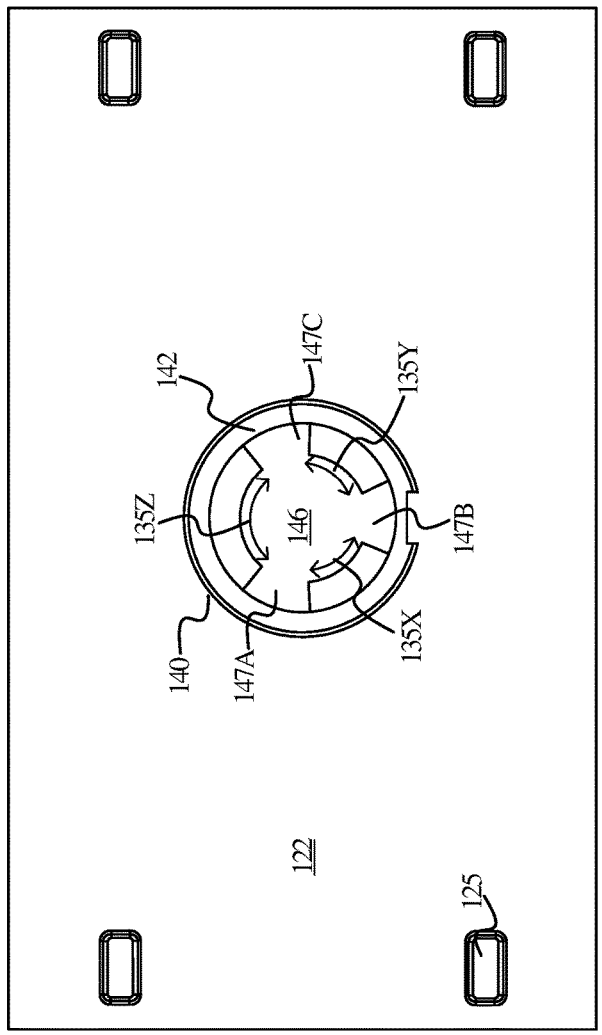
FIG. 6A shows an elevated view of the back board of the HIM, according to some embodiments.
Figure 6B:
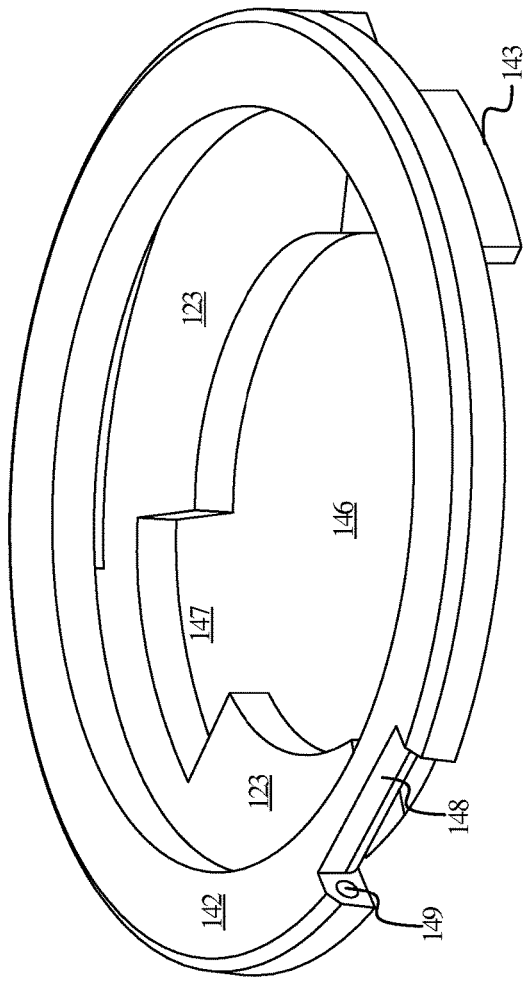
FIG. 6B shows the mounting port of the HIM, according to some embodiments.

FIGS. 6A and 6B show alternate views of the back board 122. The mounting port 140 includes the circular opening 146, where a plurality of notches 147A, 147B, 147C (collectively 147) extend radially outward from the circular opening 146. In some embodiments, the notches 147A, 147B, 147C may all have the same size and dimension. To achieve proper alignment of the cylindrical protrusion 170, the notches 147A, 147B, 147C may be spaced irregularly around the circumference of the circular opening 146. The spacing between the notches 147A, 147B, 147C is represented by circumferential distances 135X, 135Y, and 135Z, where the circumferential distance is the distance around the circumference of the circular opening 146. The circumferential distance 135X is between notches 147A and 147B. The circumferential distance 135Y is the distance between notches 147B and 147C. The circumferential distance 135Z is between 147C and 147A. The circumferential distances 135X, 135Y, and 135Z may have values that are not all equal, to achieve proper alignment of the cylindrical protrusion 170. In FIG. 6A, the circumferential distance 135X is equal to the circumferential distance 135Y, while the circumferential distance 135Z is greater than the circumferential distances 135X and 135Y.

Figure 7B:
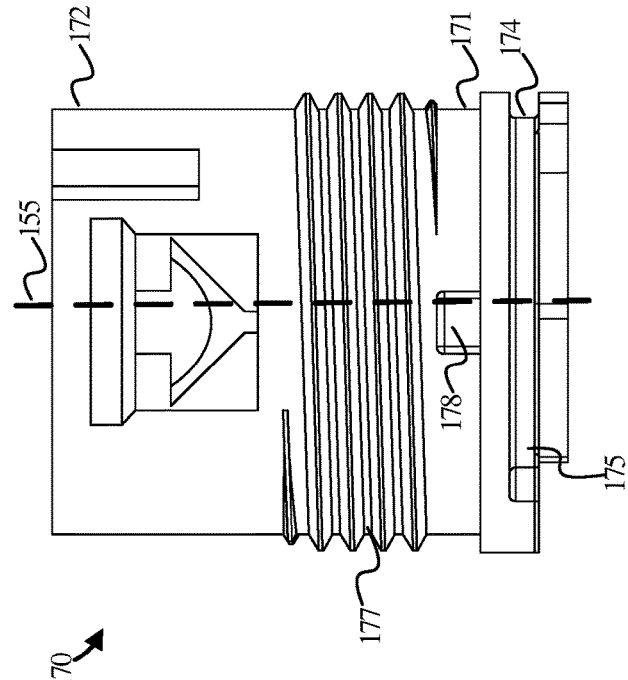
FIGS. 7A-7C show views of the cylindrical protrusion, according to some embodiments.
Figure 7C:
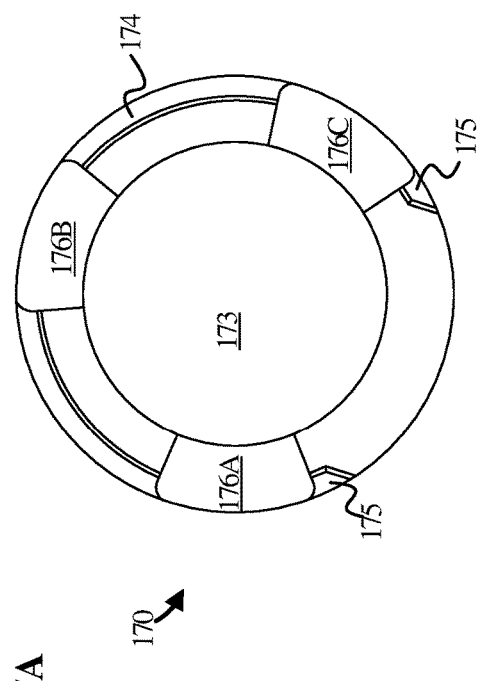
Figure 7A:
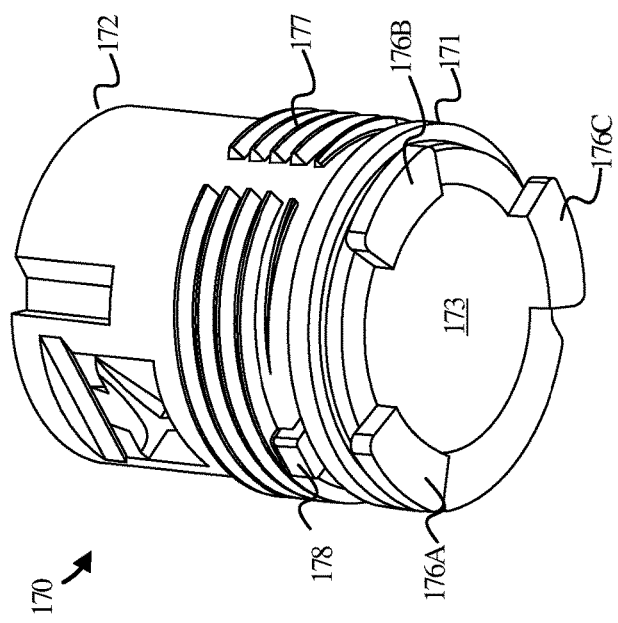

Referring additionally to FIGS. 7A-7C, the cylindrical protrusion 170 may have a first end 171 with projections 176A, 176B, and 176C extending from the first end. The projections 176A, 176B, and 176C have dimensions and spacing that correspond to the dimensions and spacing of notches 147A, 147B and 147C. As such, when the cylindrical protrusion 170 is installed in the mounting port 140, the projections 176A, 176B, and 176C are seated within the notches 147A, 147B, and 147C. This arrangement prevents cylindrical protrusion 170 from rotating relative to the mounting port 140 around the centerline 155. The projections 176A, 176B, and 176C may have an irregular spacing corresponding to the irregular spacing of the notches 147A, 147B, and 147C as discussed above. This irregular spacing provides for proper alignment of the cylindrical protrusion 170 in the mounting port 140. Specifically, the projections 176A, 176B and 176C can only be inserted in the notches 147A, 147B, and 147C when projection 176A aligns with notch 147A, projection 176B aligns with notch 147B, and projection 176C aligns with notch 147C. This arrangement aids users in achieving the correct orientation when attaching the cylindrical protrusion 170 to the mounting port 140.

Although three notches 147A, 147B and 147C and three projections 176A, 176B, and 176C are described above, other numbers of notches and projections with irregular spacing may be used. Irregular spacing is here defined to mean that the circumferential distances are not all equal, as shown by way of example with the notches 147 in FIG. 6A.

Referring again to FIG. 6B, the notches 147A, 147B, and 147C are separated by extensions 123. The extensions 123 are part of the back board 122 according to some embodiments.

The collar 142 includes a cutout 148, according to some embodiments. The cutout 148 is configured to receive the finger hold 188 of the clip 180, as demonstrated in FIGS. 4A and 4B. The cutout 148 may include a dimple 149, which corresponds to the knob 189 of the clip 180 (as seen in in FIG. 4A). When the clip 180 is installed in the mounting port, the knob 189 is seated in the dimple 149 to provide a secure installation. It is noted that while only one dimple 149 is visible due to the angle of the view in FIG. 6B, some embodiments include an additional dimple 149 on the other side of the cutout 148.

FIGS. 7A-7C show views of the cylindrical protrusion 170 according to some embodiments. The cylindrical protrusion 170 has a first end 171 and a second end 172. The first end 171 is configured to engage with the mounting port 140 of the HIM 110. The first end 171 includes projections 176A, 176B, and 176C configured to align with and sit within the notches 147A, 147B, and 147C when the cylindrical protrusion 170 is installed in the mounting port 140.

The first end 171 of the cylindrical protrusion 170 also includes a groove 174 configured to receive the clip 180 when the cylindrical protrusion 170 is installed in the mounting port 140. The groove 174 includes two widened portions 175 corresponding to the thickened end portions 183 of the clip 180 shown in FIG. 4A.

With reference to FIGS. 7A-7C and additional reference to FIGS. 1 and 2, the cylindrical protrusion 170 has dimensions corresponding to the dimensions of the hole 152 in the panel 150. When the HIM 110 is mounted on the panel, the cylindrical protrusion 170 is seated in the hole 152 such that the second end 172 of the cylindrical protrusion 170 is disposed on the opposite side of the panel 150 from the HIM 110.

The cylindrical protrusion 170 may also include an alignment extension 178, corresponding to the notch 153 in the hole 152 of the panel 150. When the cylindrical protrusion 170 is seated in the hole 152, the alignment extension 178 is seated in the notch 153. This ensures proper alignment of the cylindrical protrusion 170 with respect to the panel 150.

The alignment extension 178 ensures proper orientation of the cylindrical protrusion 170 with respect to the panel, while the projections 176A, 176B, and 176C ensure proper alignment of the cylindrical protrusion 170 with respect to the HIM 110. These combined features provide for proper orientation of the HIM 110 for users when the HIM 110 is mounted on the panel 150.

The cylindrical protrusion 170 also includes a threaded section 177. When the HIM 110 is installed on the panel 150, the threaded section 177 is disposed on the opposite side of the panel 150 from the HIM 110. The nut 158 is configured to engage with the threaded section 177 to secure the HIM 110 to the panel 150.

The cylindrical protrusion 170 also includes an internal cavity 173 extending the entire length of the cylindrical protrusion 170 along the centerline 155, from the first end 171 to the second end 172. When the HIM 110 is installed on the panel 150, the cable 154 extends through the internal cavity 173 to connect to the electrical port 130 of the HIM 110. The cable 154 thus connects the HIM 110 to a controller located on the opposite side of the panel 150.

In some embodiments, the cylindrical protrusion 170 is plastic. However, the cylindrical protrusion 170 may be another material such as metal.

Figure 8B:
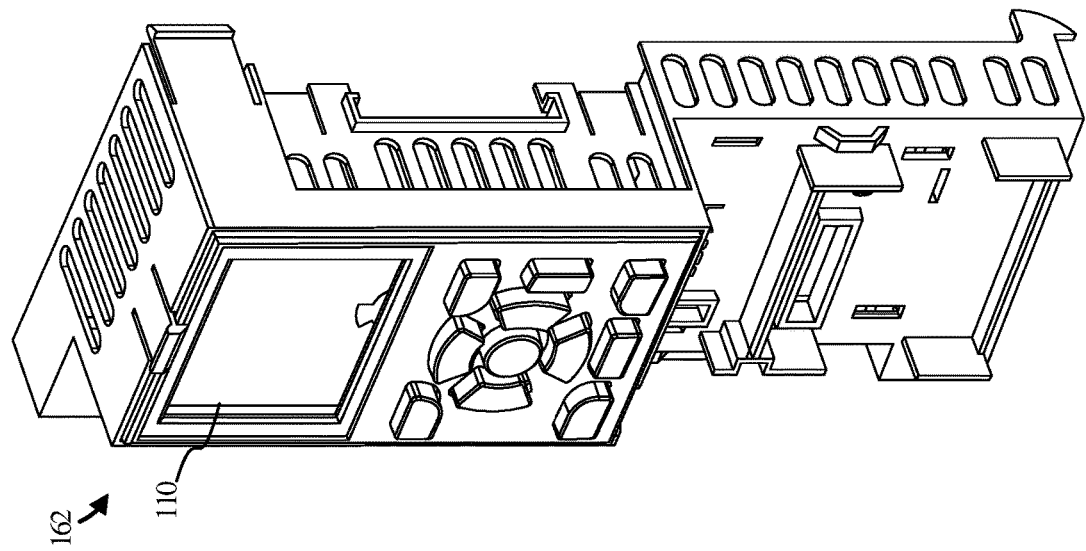
FIG. 8B shows the HIM mounted in the cradle, according to some embodiments.
Figure 8A:
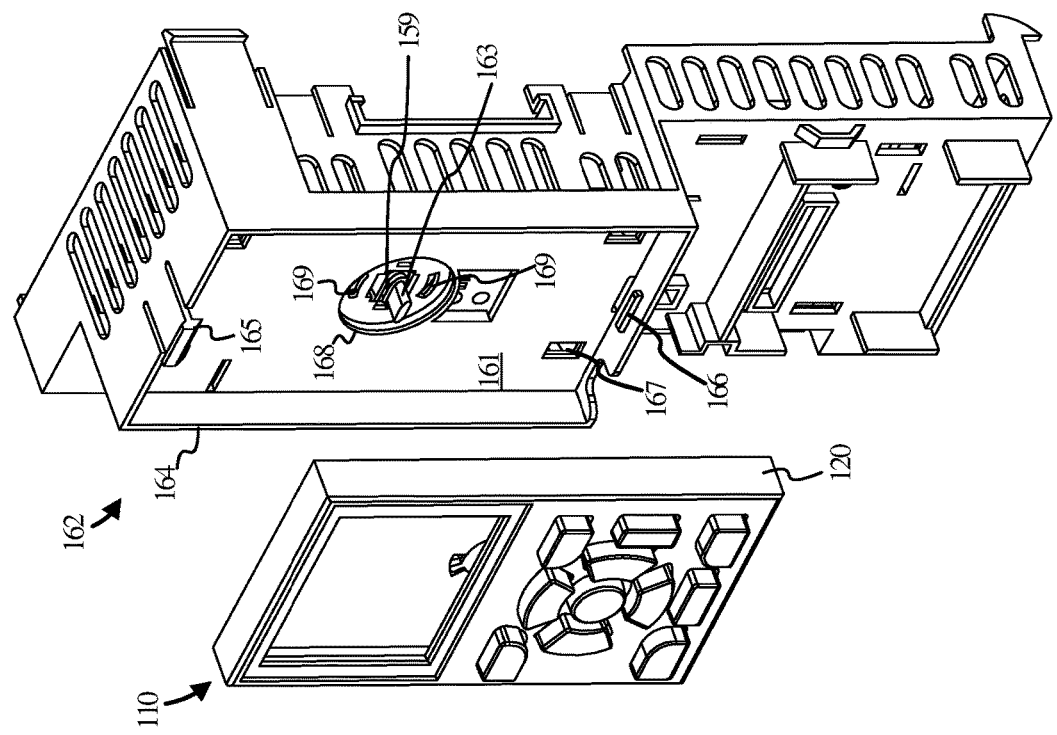
FIG. 8A shows a HIM aligned with the cradle, according to some embodiments.

FIGS. 8A and 8B show a front view of the cradle mounting configuration of the HIM 110 according to some embodiments. The cradle 162 has a back wall 161 and side walls 164 with dimensions corresponding to the casing 120 of the HIM 110. The cradle 162 may be mounted on a housing of an industrial automation controller, such as the housing 520 in FIG. 19. In other embodiments, the cradle 162 may be mounted in another location such as a panel like panel 150.

The cradle 162 includes an electrical connector 163. When the HIM 110 is mounted in the cradle 162, the HIM electrical port 130 (with further reference to FIG. 3) is coupled to the cradle electrical connector 163 to allow a user to interface with the controller. The cradle may also include a clipping extension 165, a ridge 166, and depressions 167 for securing the HIM 110 in the cradle 162. When the HIM 110 is mounted in the cradle 162, the clipping extension 165 engages with a top of the casing 120 as shown in FIG. 8B. The depressions 167 receive the feet 125 of the back board 122, and the ridge 166 is inserted into the slot 127 of the casing 120. As such, the clipping extension 165, the ridge 166, and the depressions 167 provide for a secure mounting of the HIM 110 in the cradle 162.

The cradle 162 may also include a circular cavity 168 disposed in the back wall 161. The electrical connector 163 is disposed in the circular cavity 168. When the HIM 110 is mounted in the cradle 162, the circular collar 142 is seated within the circular cavity 168. Thus, the circular collar 142 of the mounting port 140 is configured to alternatively engage with the clip 180 (for panel mounting) and the circular cavity 168 (for cradle mounting).

The circular cavity 168 includes two alignment holes 169 according to the embodiment in FIG. 8A. The alignment holes 169 are described in further detail with reference to FIGS. 9A and 9B.

Figure 9B:
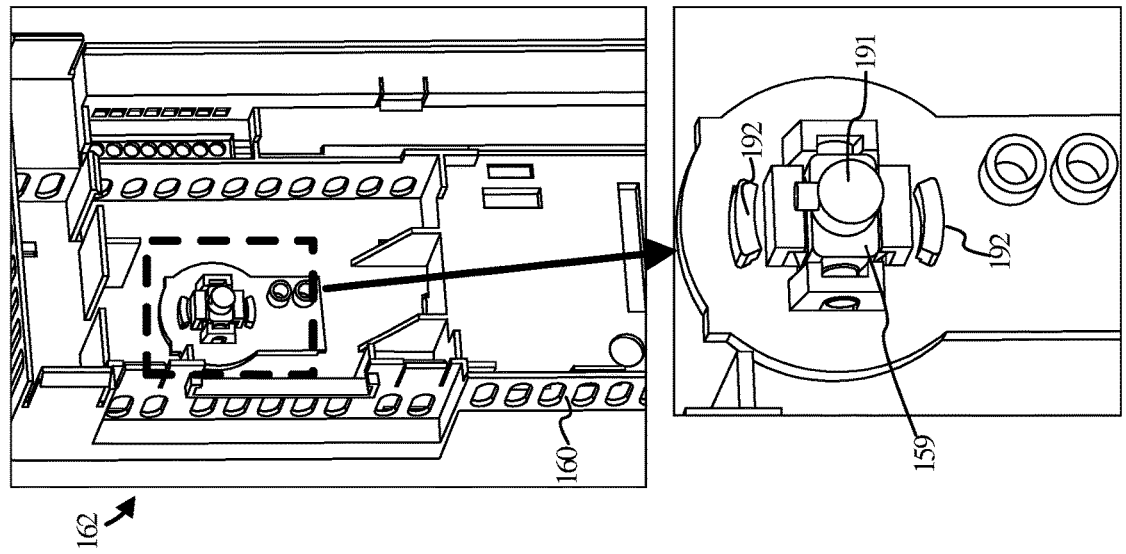
FIG. 9B shows a rear view of the cradle with a magnified view, according to some embodiments.
Figure 9A:
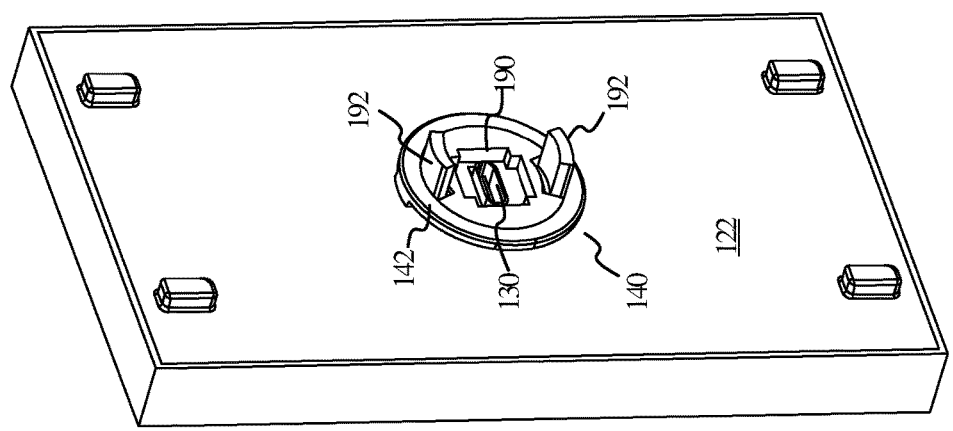
FIG. 9A shows a rear view of the HIM, according to some embodiments.

FIG. 9A shows a back view of the HIM 110 according to some embodiments, with a cradle mounting device 190 seated in the circular collar 142 of the mounting port 140. In some embodiments, the cradle mounting device 190 is plastic. However, in other embodiments the cradle mounting device may be metal or another suitable material.

The cradle mounting device 190 is removable from the HIM 110. When the HIM 110 is not mounted to a panel or cradle (such as during shipping), the cradle mounting device may be installed in the mounting port 140 to protect the interior electronics. For panel mounting of the HIM 110, the cradle mounting device 190 is removed for attachment of the cylindrical protrusion 170 to the mounting port 140.

During cradle mounting of the HIM 110, the cradle mounting device 190 remains in the mounting port 140. The cradle mounting device 190 includes a through hole 193 (with further reference to FIGS. 11A and 11B). The through hole 193 is configured to allow the electrical port 130 to pass through the cradle mounting device 190 as shown in FIG. 9A. See also FIGS. 11A and 11B for an isolated view of the cradle mounting device 190.

The cradle mounting device 190 also includes two alignment legs 192 corresponding to the two alignment holes 169 in the circular cavity 168 of the cradle 162. When the HIM 110 is mounted in the cradle 162, the alignment legs 192 are inserted into the alignment holes 169 to ensure proper engagement of the HIM's electrical port 130 with the cradle's electrical connector 163. The alignment legs 192 may also serve as finger holds for removal of the cradle mounting device 190 from the mounting port 140.

FIG. 9B shows a rear view of the cradle 162 with a magnified view. In the installed configuration, the alignment legs 192 of the cradle mounting device 190 pass through the alignment holes 169 of the cradle 162. A cable 191 (shown in a cutaway view in FIG. 9B) connects the interior electronics of the controller to the electrical connector 163 of the cradle 162.

In some embodiments, the electrical connector 163 and the cable 191 both be part of an electrical port 159 of the cradle 162. The cable 191 may be on a controller side (as shown in FIG. 9B) of the electrical port 159. The cable 191 on the controller side may be electrically coupled to the industrial automation controller, such as the industrial automation controller 500 of FIG. 19. The electrical connector 163 is on an interface side (as shown in FIG. 8A) of the electrical port 159. The connector 163 and aligns with and electrically couples to the connector of the electrical port 130 of the human interface module 110 to electrically couple the human interface module 110 with the industrial automation controller, such as the industrial automation controller 500 shown in FIG. 19.

Figure 10B:
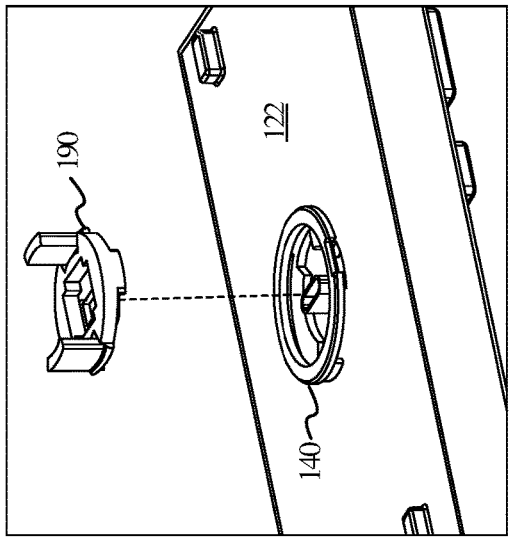
FIGS. 10A-10D show the mounting port of the HIM, according to some embodiments.
Figure 10D:
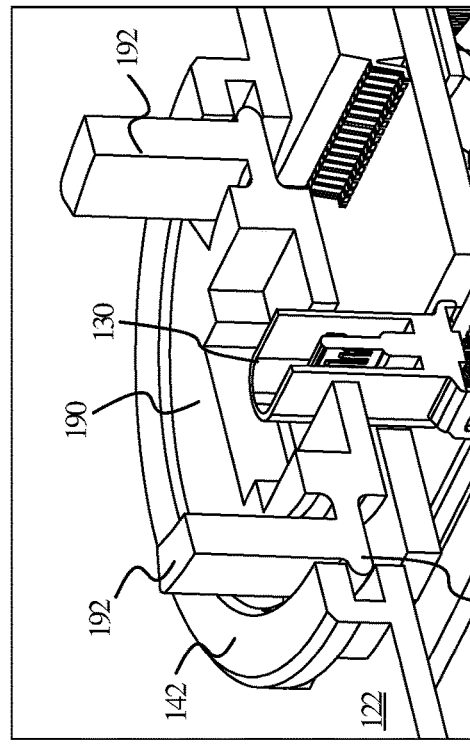
Figure 10A:
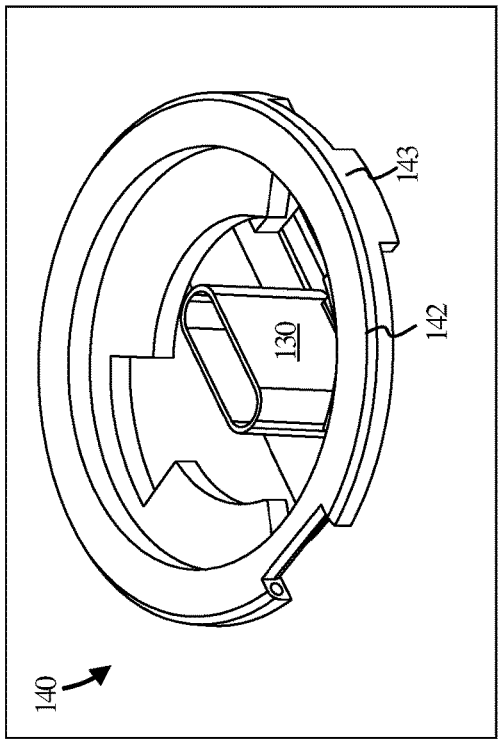
Figure 10C:
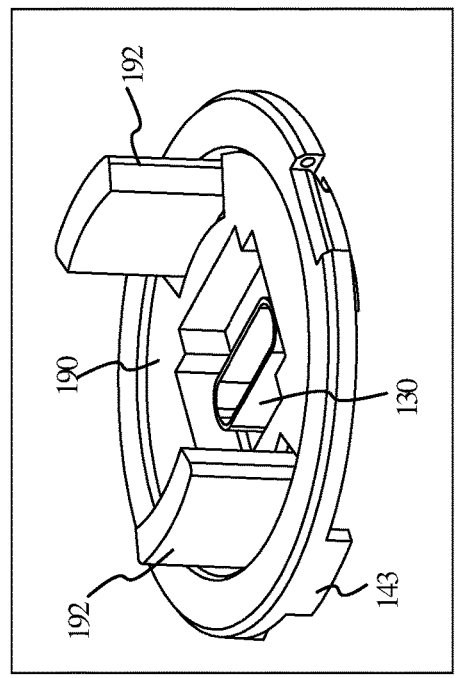

FIG. 10A shows a view of the mounting port 140 without the cradle mounting device 190 installed. FIG. 10B shows the cradle mounting device 190 aligned with the mounting port 140 for installation. FIG. 10C shows the mounting port 140 with the cradle mounting device 190 installed, with the electrical port 130 seated in the through hole 193 (see FIGS. 11A and 11B) of the cradle mounting device 190.

FIG. 10D shows a cutaway view of the cradle mounting device 190 installed in the mounting port 140. A circumferential hump 194 extends outward from the bottom portion of each alignment leg 192. When the cradle mounting device is installed, each the circumferential hump 194 is disposed between the circular collar 142 and the back board 122 to secure the cradle mounting device 190 in the mounting port 140.

Figure 11B:
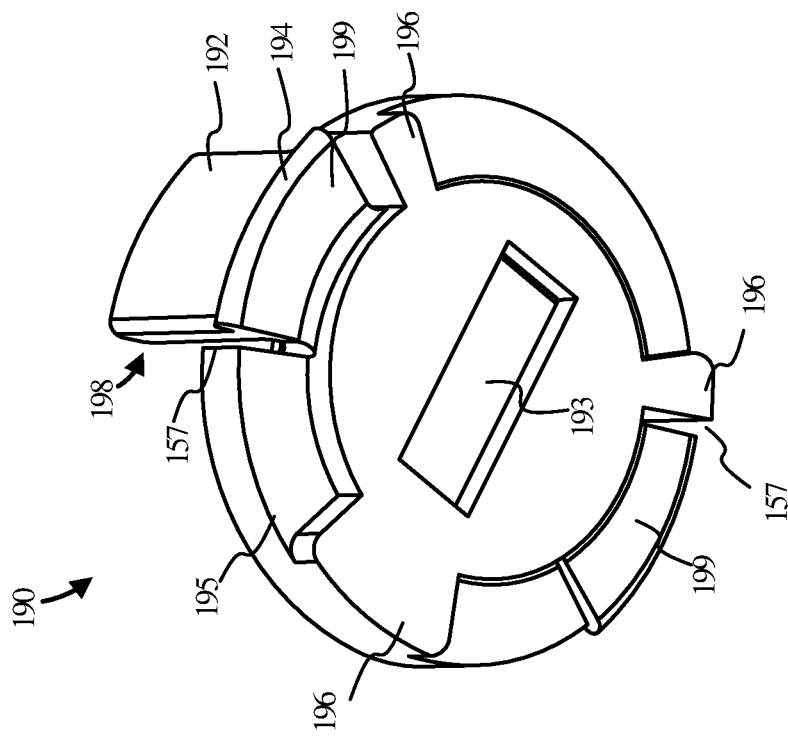
FIGS. 11A and 11B show different views of the cradle mounting device, according to some embodiments.
Figure 11A:
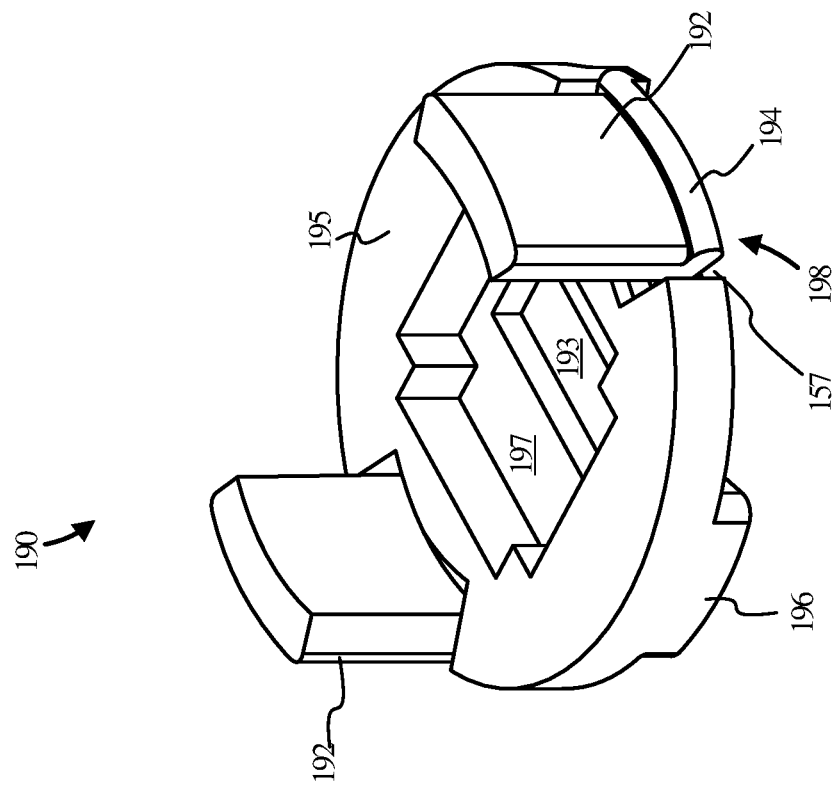

FIGS. 11A and 11B show isolation views of the cradle mounting device 190. The cradle mounting device 190 includes a main body 195 and two couplers 198. Each coupler 198 includes a flexible arm 199, an alignment leg 192, and a circumferential hump 194. Each flexible arm 199 extends from the main body 195. The alignment legs 192 extend laterally from the flexible arms 199. The circumferential humps 194 are disposed at the radial outward ends of the flexible arms 199. Gaps 157 are disposed between the flexible arms 199 and the main body 195. The gaps 157 allow the flexible arms 199 to move relative to the main body 195. When removing the cradle mounting device 190 from the mounting port 140, a user may pull the alignment legs 192 toward each other to unseat the circumferential humps 194 from the circular collar 142.

The main body 195 of the cradle mounting device 190 includes through hole 193 for receiving the electrical port 130 of the HIM 110. The through hole 193 is disposed in a concavity 197 in the main body 195. The concavity 197 is shaped to provide for a secure mating between the HIM electrical port 130 and the cradle electrical connector 163.

The lower portion of the cradle mounting device 190 includes keys 196 which are seated in the notches 147 of the mounting port 140 when the cradle mounting device 190 is installed in the mounting port 140. It is noted that the keys 196 reduced in size relative to the notches 147 to provide space for the flexible arms 199. The keys 196 prevent rotation of the cradle mounting device 190 with respect to the HIM 110 when the cradle mounting device 190 is installed in the mounting port 140.

Figure 12:
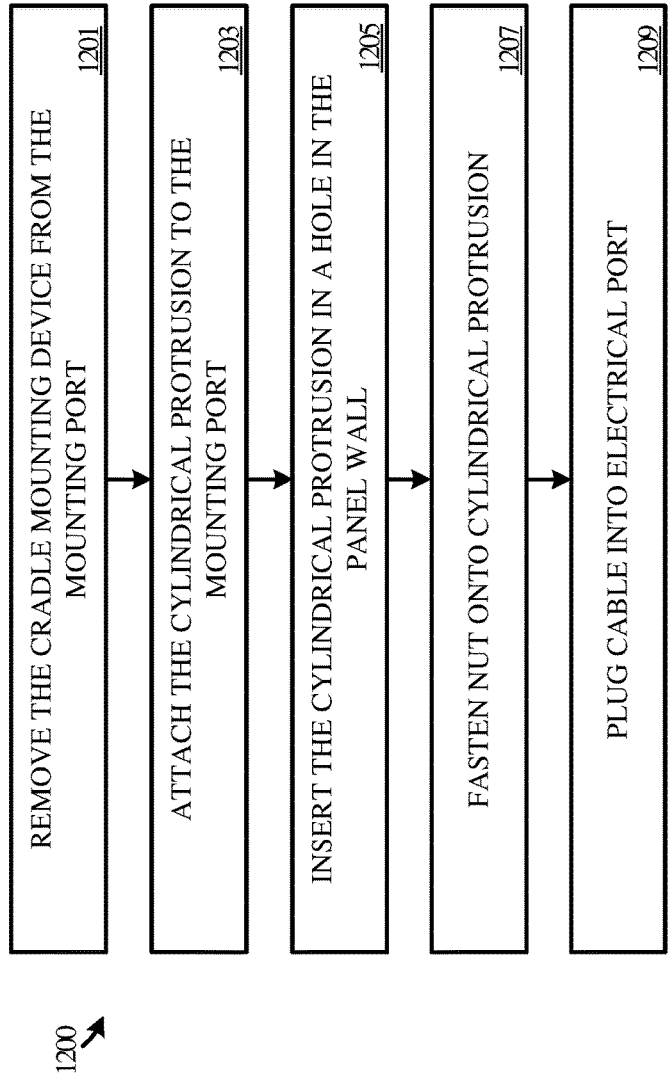
FIG. 12 shows a panel mounting method according to some embodiments, according to some embodiments.

FIG. 12 shows a method 1200 for mounting a HIM 110 to a panel 150 according to some embodiments. The method 1200 may be carried out using the systems in the figures discussed above.

Step 1201 is removing the cradle mounting device 190 from the mounting port 140 of the human interface module 110. As discussed above, the casing 120 of the HIM 110 includes a back board 122, with the mounting port 140 disposed in the back board 122. According to the embodiments discussed above, the mounting port 140 includes a circular opening 146 disposed on the back board 122. The mounting port 140 may further include at least one notch 147, each notch 147 extending from the circular opening 146 and disposed about the circumference of the circular opening 146. In some embodiments a user may remove the cradle mounting device 190 by pulling and squeezing the alignment legs 192 together to unseat the cradle mounting device 190 from the mounting port 140.

Step 1203 is attaching the cylindrical protrusion 170 to the mounting port 140. As discussed in the above embodiments the cylindrical protrusion 170 may include a first end 171, a second end 172, a threaded section 177 disposed between the first end 171 and the second end 172, and at least one projection 176 extending radially outward from the first end 171, each projection 176 corresponding to one of the at least one notch 147 of the mounting port. In some embodiments, step 1203 includes inserting each of the projections 176 into each of the notches 147. Step 1203 may include installing the clip 180 and the gasket 156 to the mounting port 140.

Step 1205 is inserting the cylindrical protrusion 170 into the hole 152 in the panel 150. In some embodiments, step 1205 includes seating the alignment extension 178 of the cylindrical protrusion 170 in the notch 153 of the hole 152.

Step 1207 is fastening the nut 158 onto the threaded section 177 of the cylindrical protrusion 170.

Step 1209 is plugging the cable 154 into the connector of the electrical port 130. Step 1209 may include passing an end of the cable 154 through the internal cavity 173 of the cylindrical protrusion 170 to plug it into the electrical port 130.

Figure 13:
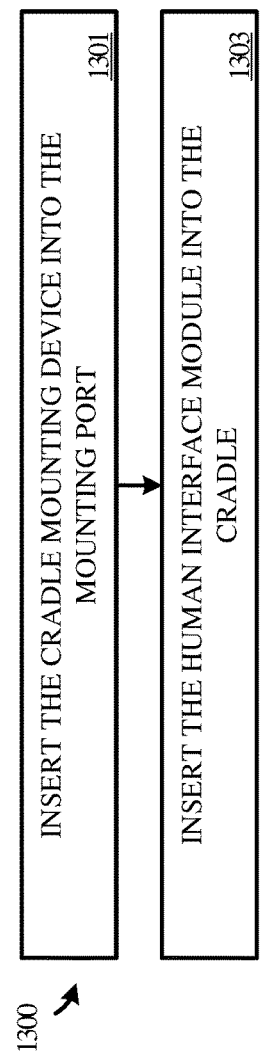
FIG. 13 shows a cradle mounting method according to some embodiments, according to some embodiments.

FIG. 13 shows a method 1300 for mounting a HIM 110 to a cradle 162 according to some embodiments. The method 1300 may be carried out using the systems in the figures discussed above.

Step 1301 is inserting the cradle mounting device 190 into the mounting port 140. It is noted that in some embodiments, the HIM 110 may be shipped to customer with the cradle mounting device 190 already inserted in the mounting port 140. In such cases, the user may leave the cradle mounting device 190 in the mounting port 140 when mounting the HIM 110 in a cradle 162.

Step 1303 is inserting the HIM 110 into the cradle 162. The HIM 110 may be inserted into the cradle 162 as shown in FIGS. 8A and 8B.

Figure 14:
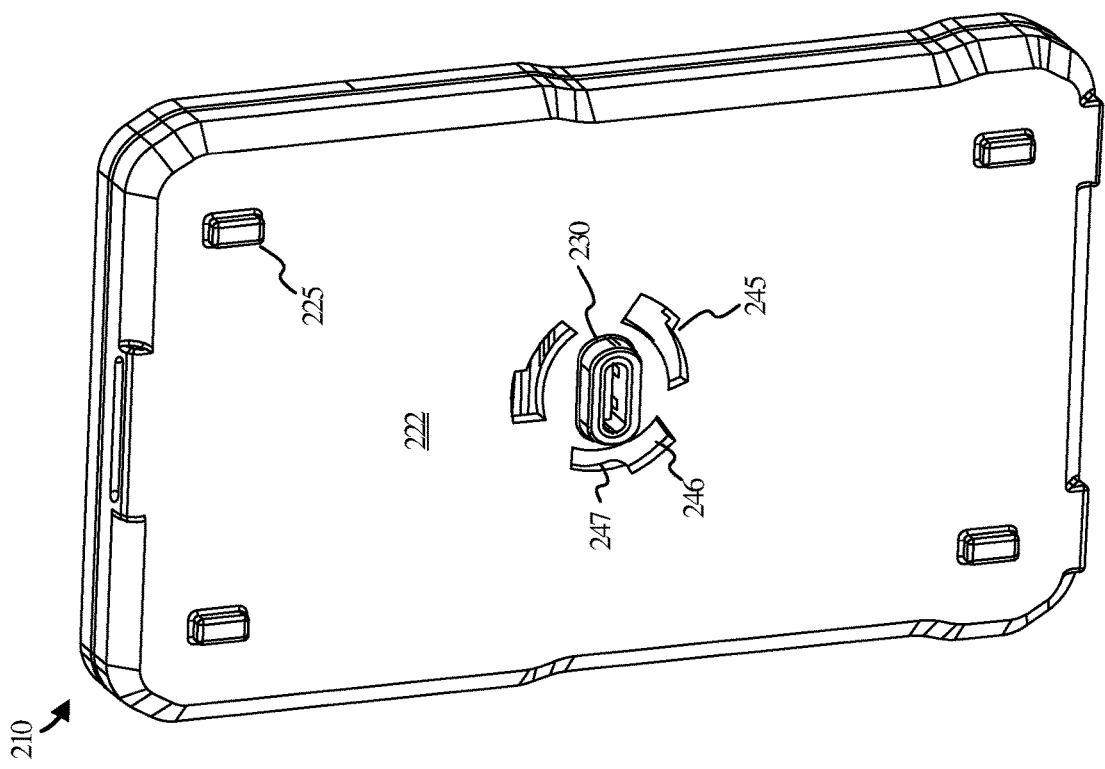
FIG. 14 shows the back of the HIM according to alternate embodiments, according to some embodiments.

FIG. 14 shows a HIM 210 according to alternative embodiments. The HIM 210 includes a casing 220 with a back board 222. The back board 222 includes feet 225 for engaging with a cradle, for example a cradle similar to the cradle 162 in FIG. 8A. The HIM 210 includes an electrical port 230 extending from the back board 222. The back board 222 includes three curved holes 245 disposed circumferentially around the electrical port 230. Each of the three curved holes 245 curves around the electrical port 230. Each curved hole 245 includes a thin portion 247 and a wide portion 246 wider than the thin portion 247.

Figure 15:
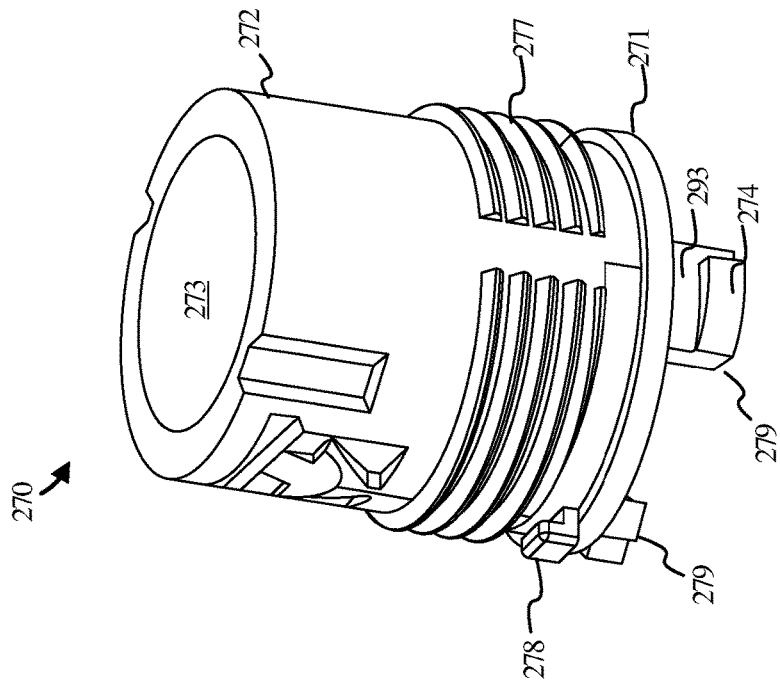
FIG. 15 shows the cylindrical protrusion, according to some embodiments.

FIG. 15 shows a cylindrical protrusion 270 configured to attach to the back board 222 of the HIM 210. The cylindrical protrusion 270 includes a first end 271 and a second end 272. The first end 271 is configured to be attached to the back board 222 of the HIM 210. The cylindrical protrusion 270 includes three mounting extensions 279 extending axially (with respect to centerline 255) from the first end 271. Each mounting extension 279 includes a thin section 293 and a tapered portion 274 adjacent to the thin section 293. As shown in FIG. 15, the tapered portions 274 is radially thicker than the thin section 293.

The cylindrical protrusion 270 further includes a threaded section 277, an alignment extension 278, and an internal cavity 273 extending the entire axial length of the cylindrical protrusion 270. These features facilitate panel mounting in a similar manner as described above with respect to the like elements including threaded section 177, alignment extension 178, and internal cavity 173 in embodiments discussed above.

Figure 16B:
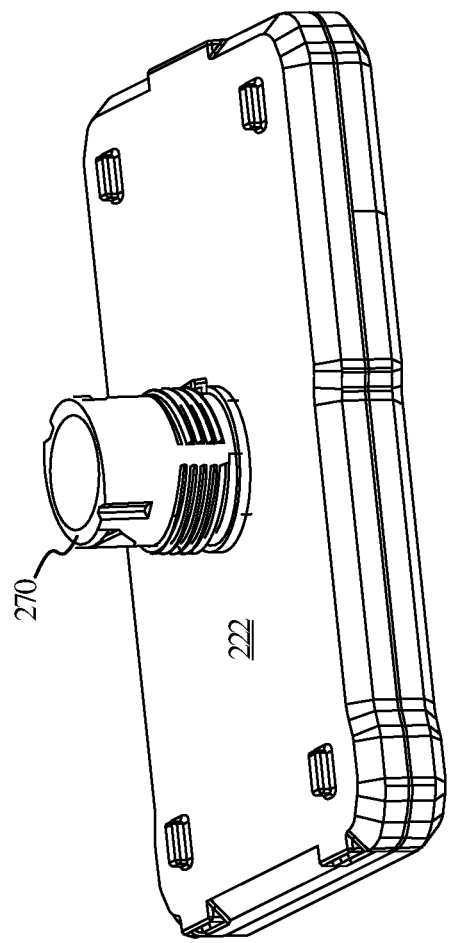
FIG. 16B shows a HIM with the cylindrical protrusion installed, according to some embodiments.
Figure 16A:
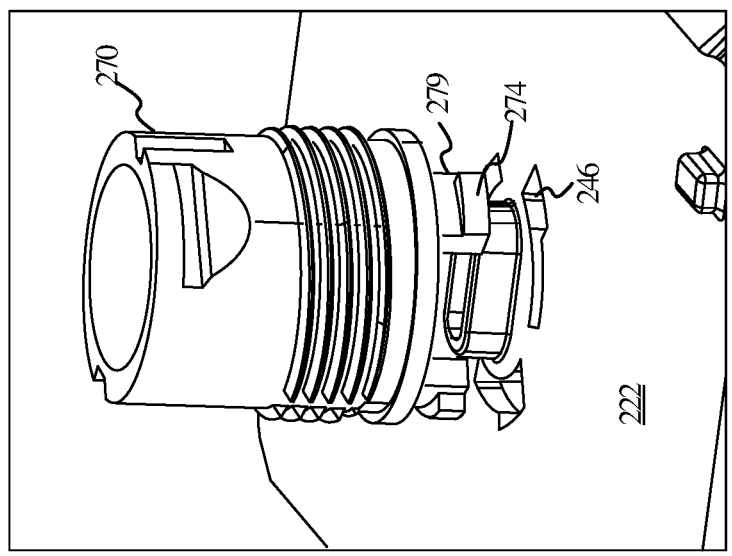
FIG. 16A shows a cylindrical protrusion aligned with the HIM, according to some embodiments.

FIGS. 16A and 16B show the mounting of a cylindrical protrusion 270 according to some embodiments. To mount the cylindrical protrusion 270, the mounting extensions 279 are aligned with the wide portions 246 of the curved holes. The mounting extensions 279 are inserted into the holes such that the tapered portion 274 is disposed on the interior side of the back board 222. The cylindrical protrusion 270 is then rotated to secure the cylindrical protrusion 270 in the back board 222 as shown in FIG. 16B.

Figure 17B:
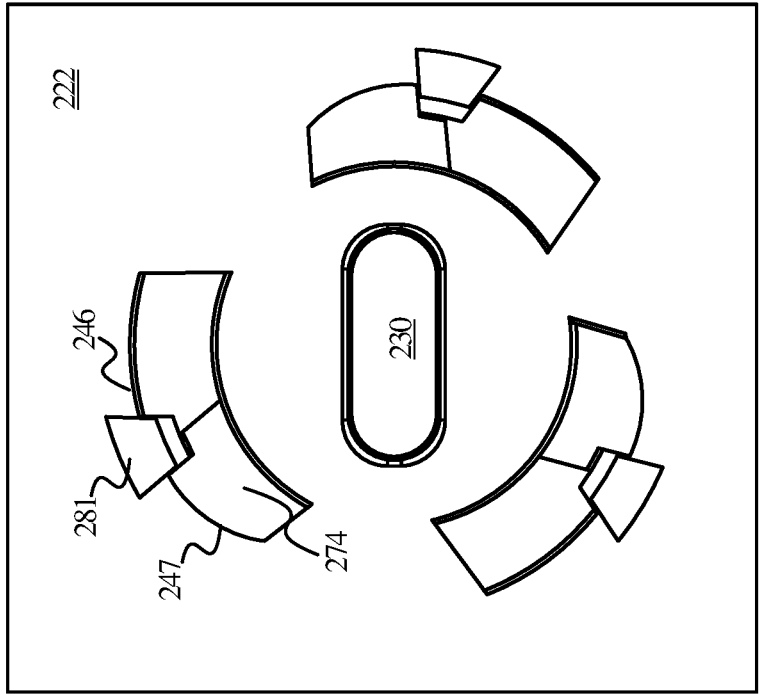
FIGS. 17A and 17B show an interior view of the back board of the HIM, according to some embodiments.
Figure 17A:
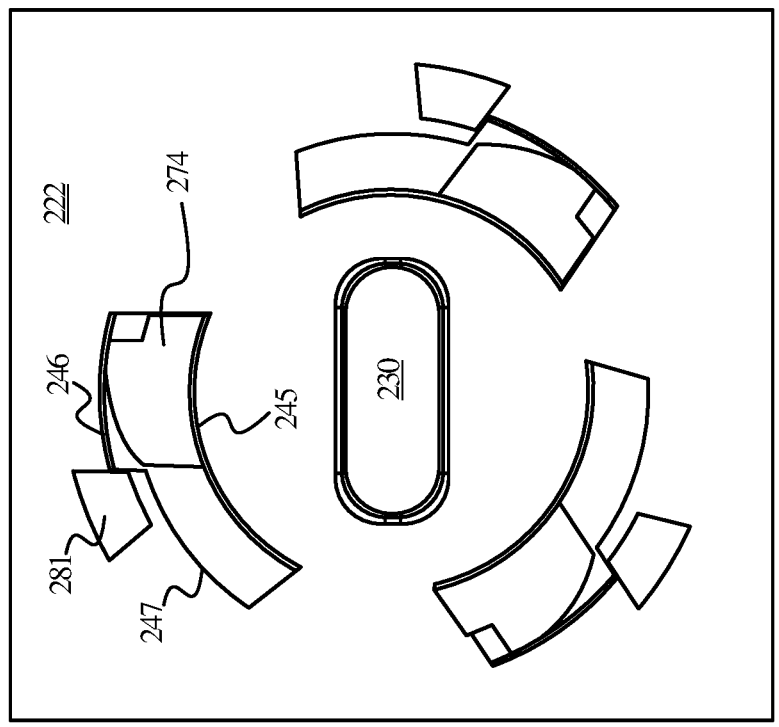

FIGS. 17A and 17B show an interior view of the back board 222 (that is, from the inside of the HIM 210 looking out). FIG. 17A shows a first step of mounting the cylindrical protrusion 270 to the back board 222, in which the tapered portions 274 are inserted in the wide portions 246 of the curved holes 245. After the rotation (counterclockwise from FIGS. 17A to 17B) the tapered portions are secured between the back board 222 and interior clasps 281. The interior clasps 281 engage with the tapered portions 274 to secure the cylindrical protrusion 270 to the back board 222.

Once the cylindrical protrusion 270 is installed on the back board 222, the HIM 210 may be mounted to a panel 150 in a similar manner as described with respect to the above embodiments. Alternatively, the HIM 210 may be mounted in a cradle. In such cases, the HIM 210 may be placed directly into the cradle without attaching the cylindrical protrusion 270.

Figure 18:
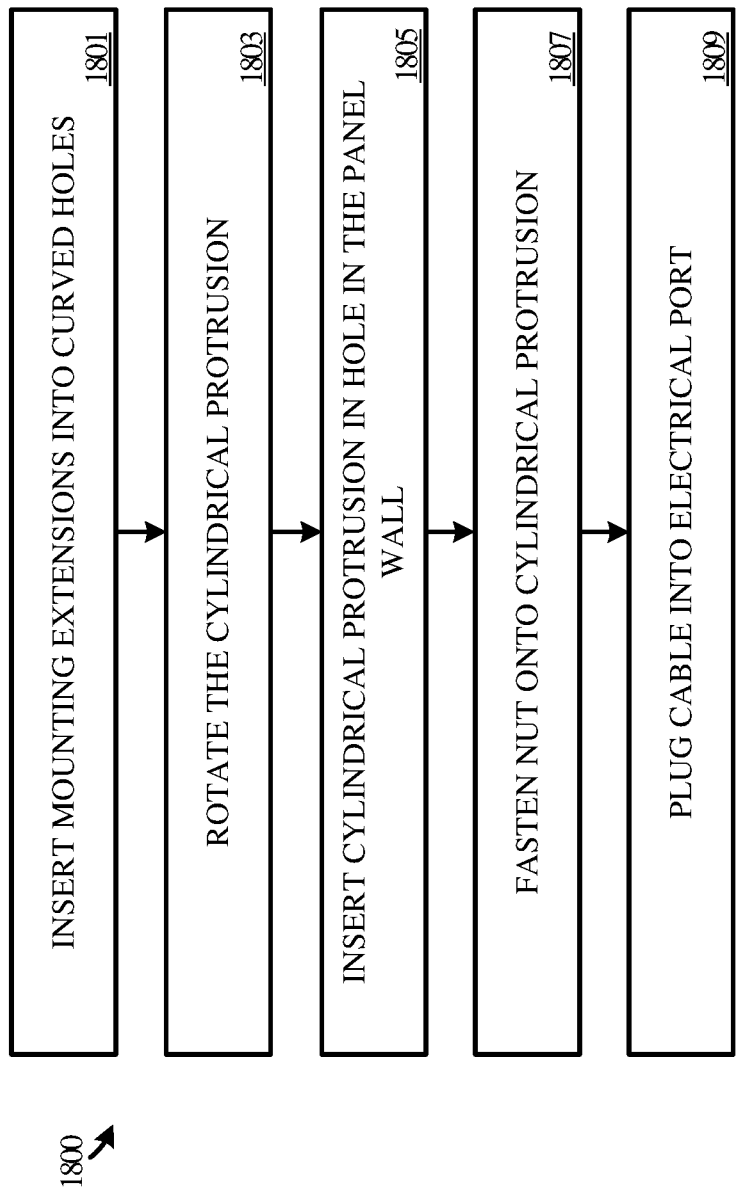
FIG. 18 shows a panel mounting method performed, according to some embodiments.

FIG. 18 shows a method 1800 for mounting a HIM 210 to a panel. The method may be performed with the HIM 210 and the cylindrical protrusion 270 as shown and described in relation to FIGS. 14-17B.

Step 1801 is inserting the mounting extensions 279 into the curved holes 245. In step 1801, the tapered portions 274 of the cylindrical protrusions 270 may be aligned with the wide portions 246 of the curved holes 245 as demonstrated in FIG. 16A for insertion of the mounting extensions 279 into the curved holes 245.

Step 1803 is rotating the cylindrical protrusion 270. The rotation of the cylindrical protrusion 270 in step 1803 secures the mounting extensions 279 within the thin sections 247 of the curved holes 245. FIG. 17A shows an interior view of the mounting extensions 279 before rotation of the cylindrical protrusion 270, and FIG. 17B shows an interior view of the mounting extensions 279 after rotation of the cylindrical protrusion 270.

Step 1805 is inserting the cylindrical protrusion 270 into the hole 152 in the panel 150 (where the panel 150 may be as shown in FIG. 2). In some embodiments, step 1805 includes seating the alignment extension 278 of the cylindrical protrusion 270 in the notch 153 of the hole 152.

Step 1807 is fastening the nut onto the threaded section 277 of the cylindrical protrusion 270. The nut may be similar to the nut 158 shown in FIG. 2.

Step 1809 is plugging the cable 154 into the electrical port 230 (where the cable 154 may be as shown in FIG. 2). Step 1209 may include passing an end of the cable 154 through the internal cavity 273 of the cylindrical protrusion 270 to plug it into the electrical port 230.

FIG. 19 shows a controller 500 in a cabinet 530 according to some embodiments of the present invention. The controller 500 may be a motor drive or any other controller. The controller 500 may interface with a HIM, such as the HIM 110 or the HIM 210 of the preceding figures. The controller 500 includes a controller housing 520 in some embodiments. A cradle such as the cradle 162 may be attached to the controller housing 520 to provide for mounting of the HIM 110 and allowing a user to interface with the controller 500.

In some embodiments, the controller 500 and the controller housing 520 are located in a cabinet 530. The cabinet 530 may contain several controllers similar to the controller 500 for operating various machines. A user may interface with the controller 500 within the cabinet 530 by mounting a HIM such as the HIM 110 or the HIM 210 to a panel of the cabinet, such as the panel 150 in the preceding figures. The HIM 110 may be mounted to the panel in the manner set forth in the preceding figures. This arrangement allows a user to interface with the controller 500 using the HIM 110, 210 without opening the cabinet 530. It is noted that the panel mounting arrangement set forth in the preceding figures does not only apply to panels on cabinets. The panel 150 of the preceding figures may be a panel in any wall or door.

FIG. 19 shows the industrial automation controller 500 includes a HIM I/O 502, a power source 504, and a machine I/O system 506. The HIM I/O 502 provides communication between the industrial automation controller 500 and a HIM, for example the HIM 110 or the HIM 210 of the preceding figures. The industrial automation controller 500 may communicate with the HIM via a cable, such as the cable 154, coupled to the HIM I/O 502. Alternatively, the controller 500 may communicate with the HIM via an electrical connector in a cradle, such as the electrical connector 163 in the cradle 162 when the HIM is mounted in the cradle 162.

The power source 504 provides power to the industrial automation controller 500 when in a powered-on state. The power source 504 may be or include any variety of power sources, such as batteries, A/C power, D/C power, solar panels, and the like. The machine I/O 506 may provide for inputs and outputs to control an industrial machine such as a motor drive.

The industrial automation controller 500 may include a memory 510 and software 512. The software 512 may be operating software that is stored in the memory 510 that, when executed by the industrial automation controller 500, causes the controller 500 to perform one or more functions. For example, an operating profile may be stored as instructions in the memory 510 that, when executed by the industrial automation controller 500, cause the industrial automation controller 500 to operate a piece of industrial equipment (e.g., conveyor belt, motor) according to the operating profile.

The above description and associated figures teach the best mode of the invention. For the purpose of teaching inventive principles, some conventional aspects of the best mode may be simplified or omitted. The following claims specify the scope of the invention. Note that some aspects of the best mode may not fall within the scope of the invention as specified by the claims. Thus, those skilled in the art will appreciate variations from the best mode that fall within the scope of the invention. Those skilled in the art will appreciate that the features described below can be combined in various ways to form multiple variations of the invention. As a result, the invention is not limited to the specific examples described below, but only by the claims and their equivalents.

Unless the context clearly requires otherwise, throughout the description and the claims, the words "include," "comprise," "comprising," and the like are to be construed in an inclusive sense, as opposed to an exclusive or exhaustive sense; that is to say, in the sense of "including, but not limited to." As used herein, the terms "connected," "coupled," or any variant thereof means any connection or coupling, either direct or indirect, between two or more elements. Additionally, the words "herein," "above," "below," and words of similar import, when used in this application, refer to this application as a whole and not to any particular portions of this application. Where the context permits, words in the above Detailed Description using the singular or plural number may also include the plural or singular number, respectively. The word "or" in reference to a list of two or more items, covers all of the following interpretations of the word: any of the items in the list, all of the items in the list, and any combination of the items in the list.

The phrases "in some embodiments," "according to some embodiments," "in the embodiments shown," "in other embodiments," and the like generally mean the particular feature, structure, or characteristic following the phrase is included in at least one implementation of the present technology and may be included in more than one implementation. In addition, such phrases do not necessarily refer to the same embodiments or different embodiments.

The above Detailed Description is not intended to be exhaustive or to limit the technology to the precise form disclosed above. While specific examples of the technology are described for illustrative purposes, various equivalent modifications are possible within the scope of the technology, as those skilled in the relevant art will recognize. Further any specific numbers noted herein are only examples: alternative implementations may employ differing values or ranges.

The teachings of the technology provided herein can be applied to other systems, not necessarily the system described above. The elements and acts of the various examples described above can be combined to provide further implementations of the technology. Some alternative implementations of the technology may include not only additional elements to those implementations noted above, but also may include fewer elements.

These and other changes can be made to the technology in light of the above Detailed Description. While the above description describes certain examples of the technology, and describes the best mode contemplated, no matter how detailed the above appears in text, the technology can be practiced in several ways. Details of the system may vary considerably in its specific implementation, while still being encompassed by the technology disclosed herein. As noted above, particular terminology used when describing certain features or aspects of the technology should not be taken to imply that the terminology is being redefined herein to be restricted to any specific characteristics, features, or aspects of the technology with which that terminology is associated. In general, the terms used in the following claims should not be construed to limit the technology to the specific examples disclosed in the specification, unless the above Detailed Description section explicitly defines such terms. Accordingly, the actual scope of the technology encompasses not only the disclosed examples, but also all equivalent ways of practicing or implementing the technology under the claims.

To reduce the number of claims, certain aspects of the technology are presented below in certain claim forms, but the applicant contemplates the various aspects of the technology in any number of claim forms. For example, while only one aspect of the technology is recited as a computer-readable medium claim, other aspects may likewise be embodied as a computer-readable medium claim, or in other forms, such as being embodied in a means-plus-function claim. Any claims intended to be treated under 35 U.S.C. § 112(f) will begin with the words "means for" but use of the term "for" in any other context is not intended to invoke treatment under 35 U.S.C. § 112(f). Accordingly, the applicant reserves the right to pursue additional claims after filing this application to pursue such additional claim forms, in either this application or in a continuing application.

What is claimed is:

1. A system, comprising:
    a human interface module, comprising:
        an electrical port, comprising:
            a connector, wherein the connector receives an electrical connection that electrically couples the human interface module with an industrial automation controller,
        a casing comprising a back board, the back board comprising a mounting port,
            wherein the connector of the electrical port is disposed in the mounting port,
            and wherein the mounting port comprises:
                a circular opening disposed in the back board; and
                at least one notch, each notch extending from the circular opening and disposed about a circumference of the circular opening; and
    a panel mounting device, comprising:
        a cylindrical protrusion, comprising:
            a first end,
            a second end,
            a threaded section disposed between the first end and the second end, and
            at least one projection extending radially outward from the first end, each projection corresponding to one of the at least one notches of the mounting port,
            wherein the at least one projection aligns with the at least one notch of the mounting port to couple the panel mounting device to the human interface module.

2. The system of claim 1, wherein the electrical port is a first electrical port, the system further comprising:
    a cradle mounting device; and
    a cradle, comprising:
        one or more clips that couple with the human interface module to secure the human interface module in the cradle; and
        a second electrical port, comprising:
            a controller side electrically coupled to the industrial automation controller; and
            an interface side comprising a second connector disposed on the cradle and that aligns with and electrically couples to the connector of the electrical port of the human interface module to electrically couple the human interface module with the industrial automation controller.

3. The system of claim 1, wherein the at least one notch comprises three notches, each notch having the same shape and size, wherein the three notches are not evenly spaced about the circumference of the circular opening.

4. The system of claim 3, wherein the at least one projection comprises three projections, and wherein each of the three projections aligns with one of the three notches.

5. The system of claim 1, wherein the mounting port further comprises:
    a circular collar disposed around the circular opening such that a center of the circular collar is at a center of the circular opening, wherein the circular collar engages with a clip, and wherein the clip secures the cylindrical protrusion to the back board when the clip is engaged with the circular collar.

6. The system of claim 5, wherein:
    the clip comprises a C-shaped body; and
    the cylindrical protrusion further comprises a groove corresponding to the C-shaped body that engages with the C-shaped body.

7. The system of claim 5, further comprising:
    a circular gasket surrounding the circular collar, the circular gasket comprising:
        a first side that forms a seal with the back board of the human interface module, and
        a second side that forms a seal with a panel.

8. The system of claim 5 further comprising:
    a cradle mounting device that engages with the circular collar, the cradle mounting device comprising:
        a circular body that covers the circular opening of the mounting port, the circular body comprising:
            a hole that receives the connector of the electrical port.

9. The system of claim 8, further comprising:
    a cradle that receives the human interface module, the cradle comprising:
        two attachment holes; and
    wherein the cradle mounting device further comprises:
        two extension arms extending laterally from the circular body, wherein each of the two extension arms fit within one of the two attachment holes of the cradle.

10. The system of claim 1, wherein the cylindrical protrusion further comprises:
    an alignment extension that aligns with an alignment notch in a panel hole in a panel of a cabinet housing enclosing the industrial automation controller.

11. The system of claim 10, further comprising:
a nut that engages with the threaded section of the cylindrical protrusion.

12. A panel mounting system comprising:
a cylindrical protrusion comprising:
- a first end that engages with a mounting port of a human interface module,
- a second end, and
- a threaded section disposed between the first end and the second end; and
- three projections extending radially outward from the first end, wherein:
  - the three projections engage with three notches of the mounting port,
  - the three projections are not evenly spaced around a circumference of the cylindrical protrusion,
  - each of the three projections correspond to one of the three notches of the mounting port,
  - each of the three projections align with one of the three notches to couple the cylindrical protrusion to the mounting port.

13. The panel mounting system of claim 12, further comprising:
a clip that engages with a circular collar on the mounting port to secure the cylindrical protrusion to the human interface module.

14. The panel mounting system of claim 13, wherein:
the clip comprises a C-shaped body; and
the cylindrical protrusion further comprises a groove corresponding to the C-shaped body that engages with the C-shaped body.

15. The panel mounting system of claim 13, further comprising:
a circular gasket surrounding the circular collar, the circular gasket comprising:
- a first side that forms a seal with a back board of the human interface module, and
- a second side that forms a seal with a panel.

16. The panel mounting system of claim 12, wherein cylindrical protrusion further comprises an alignment extension that aligns with a notch in a panel hole.

17. The panel mounting system of claim 16, further comprising:
a nut that engages with the threaded section of the cylindrical protrusion.

18. The panel mounting system of claim 12, wherein the cylindrical protrusion further comprises an internal cavity extending from the first end to the second end.

19. The panel mounting system of claim 12, further comprising:
the human interface module, comprising:
the mounting port, comprising:
the three notches, wherein the mounting port is removably coupled to the first end of the cylindrical protrusion.

20. A method of installing a human interface module onto a panel, the method comprising:
removing a cradle mounting device from a mounting port of the human interface module, wherein the human interface module comprises a casing, the casing comprising a back board, wherein the mounting port is disposed in the back board, and wherein the mounting port comprises a circular opening disposed on the back board, and wherein the mounting port further comprises at least one notch, each notch extending from the circular opening and disposed about a circumference of the circular opening;
attaching a cylindrical protrusion to the mounting port, wherein the cylindrical protrusion comprises
a first end,
a second end,
a threaded section disposed between the first end and the second end, and
at least one projection extending radially outward from the first end, each projection corresponding to one of the at least one notches of the mounting port,
wherein the attaching the cylindrical protrusion to the mounting port comprises inserting each of the at least one projection into each of the at least one notch of the circular opening;
inserting the cylindrical protrusion in a hole in a panel; and
fastening a nut onto the threaded section of the cylindrical protrusion.

* * * * *